United States Patent
Wang et al.

(10) Patent No.: US 11,910,684 B2
(45) Date of Patent: Feb. 20, 2024

(54) PIXEL ARRANGEMENT STRUCTURE, DISPLAY METHOD AND PREPARING METHOD OF PIXEL ARRANGEMENT STRUCTURE, AND DISPLAY SUBSTRATE

(71) Applicant: BOE TECHNOLOGY GROUP CO., LTD., Beijing (CN)

(72) Inventors: Hongli Wang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/890,427

(22) Filed: Aug. 18, 2022

(65) Prior Publication Data

US 2022/0392971 A1    Dec. 8, 2022

Related U.S. Application Data

(63) Continuation of application No. 16/483,210, filed as application No. PCT/CN2018/124404 on Dec. 27, 2018, now Pat. No. 11,462,589.

(30) Foreign Application Priority Data

Feb. 9, 2018  (CN) .......................... 201810136335.4

(51) Int. Cl.
   *H10K 59/35*     (2023.01)
   *H10K 71/00*     (2023.01)

(52) U.S. Cl.
   CPC .......... *H10K 59/353* (2023.02); *H10K 71/00* (2023.02)

(58) Field of Classification Search
   None
   See application file for complete search history.

(56) References Cited

U.S. PATENT DOCUMENTS

| 4,491,863 A | 1/1985 | Kurahashi |
| 4,652,912 A | 3/1987 | Masubushi |

(Continued)

FOREIGN PATENT DOCUMENTS

| CN | 101192382 A | 6/2008 |
| CN | 101339729 A | 6/2010 |

(Continued)

OTHER PUBLICATIONS

Office Action from Japanese Patent Application No. 2019-569438 dated Mar. 27, 2023.

(Continued)

*Primary Examiner* — Michelle Mandala
(74) *Attorney, Agent, or Firm* — Dilworth & Barrese, LLP.; Michael J. Musella, Esq.

(57) ABSTRACT

A pixel arrangement structure, a display method and a preparing method of a pixel arrangement structure, and a display substrate are provided. The pixel arrangement structure includes first color sub-pixel blocks, second color sub-pixel blocks, and third color sub-pixel blocks. Each of the plurality of minimum repeating regions has a rectangular shape and includes a first virtual rectangle, and the first virtual rectangle includes one first color sub-pixel block, one second color sub-pixel block and one third color sub-pixel block. Any edge of the first virtual rectangle has a non-zero included angle with a first direction, and the first direction is a row direction or a column direction. The first color sub-pixel block is on a perpendicular bisector of the first edge, the second color sub-pixel block and the third color sub-pixel block are on different sides of the perpendicular bisector of the first edge.

17 Claims, 6 Drawing Sheets

(56) References Cited

U.S. PATENT DOCUMENTS

| | | |
|---|---|---|
| 5,113,274 A | 5/1992 | Takahashi et al. |
| 5,341,153 A | 8/1994 | Benzschawel et al. |
| 6,681,053 B1 | 1/2004 | Zhu |
| 6,768,482 B2 | 7/2004 | Asano et al. |
| 6,950,115 B2 | 9/2005 | Brown Elliott |
| 7,123,277 B2 | 10/2006 | Brown Elliott et al. |
| 7,187,425 B2 | 3/2007 | Yamazaki |
| 7,525,526 B2 | 4/2009 | Brown Elliott et al. |
| 7,663,299 B2 | 2/2010 | Chao et al. |
| 7,733,359 B1 | 6/2010 | Hagge et al. |
| 8,115,216 B2 | 2/2012 | Smith et al. |
| 8,159,508 B2 | 4/2012 | Lee |
| 8,207,924 B2 | 6/2012 | Horiuchi et al. |
| 8,330,352 B2 | 12/2012 | Sung et al. |
| 8,363,072 B2 | 1/2013 | Hong et al. |
| 8,446,435 B2 | 5/2013 | Tomizawa et al. |
| 8,754,913 B2 | 6/2014 | Hwang et al. |
| 8,994,015 B2 | 3/2015 | Pyon et al. |
| 9,064,450 B2 | 6/2015 | Kashiwabara |
| 9,337,241 B2 | 5/2016 | Lee et al. |
| 9,343,511 B1 | 5/2016 | Feng |
| 9,424,771 B2 | 8/2016 | Gong |
| 9,542,875 B2 | 1/2017 | Yang et al. |
| 9,570,706 B2 | 2/2017 | Yim et al. |
| 9,589,492 B2 | 3/2017 | Feng |
| 9,647,039 B1 | 5/2017 | Wang et al. |
| 9,691,317 B2 | 6/2017 | Li |
| 9,704,926 B2 | 7/2017 | Kim |
| 9,734,753 B2 | 8/2017 | Li et al. |
| 9,818,803 B2 | 11/2017 | Lee |
| 9,858,847 B2 * | 1/2018 | Matsueda ............ G09G 3/2003 |
| 9,871,085 B2 | 1/2018 | Cho et al. |
| 9,905,604 B2 | 2/2018 | Murata |
| 9,941,334 B2 | 4/2018 | Hsu et al. |
| 9,946,123 B2 | 4/2018 | Huangfu et al. |
| 9,972,256 B2 | 5/2018 | Kang et al. |
| 9,984,624 B2 | 5/2018 | Takahashi et al. |
| 9,995,952 B2 | 6/2018 | Chen |
| 10,141,380 B2 | 11/2018 | Chung et al. |
| 10,147,351 B2 | 12/2018 | Yang et al. |
| 10,181,499 B2 | 1/2019 | Jo et al. |
| 10,210,787 B2 | 2/2019 | Jin |
| 10,224,380 B2 | 3/2019 | Hsu et al. |
| 10,274,654 B2 | 4/2019 | Jim et al. |
| 10,283,086 B1 | 5/2019 | Su et al. |
| 10,373,541 B2 | 8/2019 | Lee et al. |
| 10,504,419 B2 | 12/2019 | Xi et al. |
| 10,504,483 B2 | 12/2019 | Chen et al. |
| 10,565,918 B2 | 2/2020 | Wu et al. |
| 10,579,173 B2 | 3/2020 | Xu et al. |
| 10,629,656 B2 | 4/2020 | Jo et al. |
| 10,672,318 B2 | 6/2020 | Lee et al. |
| 10,699,642 B2 | 6/2020 | Ma et al. |
| 10,840,307 B2 | 11/2020 | Gu et al. |
| 10,854,684 B2 | 12/2020 | Huangfu et al. |
| 10,861,905 B2 | 12/2020 | Wang |
| 10,867,545 B2 | 12/2020 | Kirisken |
| 10,902,789 B2 | 1/2021 | Park |
| 10,903,281 B2 | 1/2021 | Chung et al. |
| 10,909,901 B2 | 2/2021 | Wu et al. |
| 10,909,904 B2 | 2/2021 | Kim |
| 10,923,077 B2 | 2/2021 | Matsueda |
| 10,943,955 B2 | 3/2021 | Wang et al. |
| 10,953,191 B2 | 3/2021 | Mok et al. |
| 10,971,054 B2 | 4/2021 | Zhao et al. |
| 10,971,555 B2 | 4/2021 | Liu et al. |
| 10,991,768 B2 | 4/2021 | Li et al. |
| 11,004,905 B2 | 5/2021 | Sun et al. |
| 11,043,539 B2 | 6/2021 | Jo et al. |
| 11,062,637 B2 | 7/2021 | Jeong et al. |
| 11,069,286 B2 | 7/2021 | Tan et al. |
| 11,120,715 B2 | 9/2021 | Kwon et al. |
| 11,232,750 B2 | 1/2022 | Wang et al. |
| 11,233,096 B2 | 1/2022 | Huangfu et al. |
| 11,238,816 B2 | 2/2022 | Huangfu et al. |
| 11,264,430 B2 | 3/2022 | Huangfu et al. |
| 11,462,591 B2 | 10/2022 | Liu et al. |
| 2004/0046714 A1 | 3/2004 | Elliott |
| 2005/0018110 A1 | 1/2005 | Liu |
| 2007/0205423 A1 | 9/2007 | Yamazaki et al. |
| 2007/0205432 A1 | 9/2007 | Yamazaki et al. |
| 2007/0290973 A1 | 12/2007 | Wei |
| 2008/0001525 A1 | 1/2008 | Chao et al. |
| 2008/0231554 A1 | 9/2008 | Lee |
| 2009/0021534 A1 | 1/2009 | Tomizawa et al. |
| 2009/0079351 A1 | 3/2009 | Choi et al. |
| 2009/0121983 A1 | 5/2009 | Sung et al. |
| 2009/0302331 A1 | 12/2009 | Smith et al. |
| 2011/0025723 A1 | 2/2011 | Kim et al. |
| 2011/0127506 A1 | 6/2011 | So |
| 2011/0128262 A1 | 6/2011 | Chaji et al. |
| 2011/0234550 A1 | 9/2011 | Hong et al. |
| 2011/0260951 A1 | 10/2011 | Hwang et al. |
| 2011/0260952 A1 | 10/2011 | Hwang et al. |
| 2012/0039034 A1 | 2/2012 | Jepsen et al. |
| 2012/0092238 A1 | 4/2012 | Hwang et al. |
| 2012/0313844 A1 | 12/2012 | Im et al. |
| 2013/0140030 A1 | 6/2013 | Rankin |
| 2013/0234917 A1 | 9/2013 | Lee |
| 2014/0003045 A1 | 1/2014 | Lee et al. |
| 2014/0071030 A1 | 3/2014 | Lee |
| 2014/0071175 A1 | 3/2014 | Yang et al. |
| 2014/0145586 A1 | 5/2014 | Choi |
| 2014/0198479 A1 | 7/2014 | Chao et al. |
| 2014/0226323 A1 | 8/2014 | Huang |
| 2014/0252321 A1 | 9/2014 | Pyon et al. |
| 2014/0284570 A1 | 9/2014 | Jinta et al. |
| 2014/0292622 A1 | 10/2014 | Lee |
| 2014/0346537 A1 | 11/2014 | Xi |
| 2015/0008820 A1 | 1/2015 | Lee |
| 2015/0015465 A1 | 1/2015 | Gong |
| 2015/0015466 A1 | 1/2015 | Feng |
| 2015/0015600 A1 | 1/2015 | Yang et al. |
| 2015/0021637 A1 | 1/2015 | Ahn et al. |
| 2015/0102320 A1 | 4/2015 | Jung |
| 2015/0162391 A1 | 6/2015 | Kim |
| 2015/0162394 A1 | 6/2015 | Tokuda et al. |
| 2015/0200237 A1 | 7/2015 | Yim et al. |
| 2015/0270317 A1 | 9/2015 | Lee et al. |
| 2015/0311264 A1 | 10/2015 | Shen et al. |
| 2015/0311265 A1 | 10/2015 | Matsueda et al. |
| 2015/0379916 A1 | 12/2015 | Guo et al. |
| 2016/0013251 A1 | 1/2016 | Yoshida et al. |
| 2016/0019825 A1 | 1/2016 | Guo et al. |
| 2016/0027360 A1 | 1/2016 | Li |
| 2016/0049438 A1 | 2/2016 | Murata |
| 2016/0078807 A1 | 3/2016 | Sun et al. |
| 2016/0104413 A1 | 4/2016 | Matsueda et al. |
| 2016/0121073 A1 | 5/2016 | Mok et al. |
| 2016/0126295 A1 | 5/2016 | Sato |
| 2016/0126296 A1 | 5/2016 | Feng |
| 2016/0126298 A1 | 5/2016 | Chen |
| 2016/0133181 A1 | 5/2016 | Nakamura |
| 2016/0155781 A1 | 6/2016 | Chaji |
| 2016/0163247 A1 | 6/2016 | Lee et al. |
| 2016/0171918 A1 | 6/2016 | Kim et al. |
| 2016/0196776 A1 | 7/2016 | Yang et al. |
| 2016/0203748 A1 | 7/2016 | Matsueda et al. |
| 2016/0240593 A1 | 8/2016 | Gu et al. |
| 2016/0253943 A1 | 9/2016 | Wang |
| 2016/0254476 A1 | 9/2016 | Park |
| 2016/0293678 A1 | 10/2016 | Wang |
| 2016/0300892 A1 | 10/2016 | Bai et al. |
| 2016/0343284 A1 | 11/2016 | Sun |
| 2016/0351119 A1 | 12/2016 | Ono |
| 2016/0357076 A1 | 12/2016 | Huangfu et al. |
| 2016/0358536 A1 | 12/2016 | Li et al. |
| 2016/0358985 A1 | 12/2016 | Bai et al. |
| 2016/0370919 A1 | 12/2016 | Xu et al. |
| 2017/0039924 A1 | 2/2017 | Jin |
| 2017/0098419 A1 | 4/2017 | Kang et al. |
| 2017/0110087 A1 | 4/2017 | Chen et al. |
| 2017/0133440 A1 | 5/2017 | Wang et al. |
| 2017/0179389 A1 | 6/2017 | Cho et al. |

(56) References Cited

U.S. PATENT DOCUMENTS

| | | |
|---|---|---|
| 2017/0193880 A1 | 7/2017 | Lee et al. |
| 2017/0278905 A1 | 9/2017 | Hsu et al. |
| 2017/0294155 A1 | 10/2017 | Kim |
| 2017/0294491 A1 | 10/2017 | Jo et al. |
| 2017/0317150 A1 | 11/2017 | Chung et al. |
| 2017/0352710 A1 | 12/2017 | Hong et al. |
| 2018/0012547 A1 | 1/2018 | Li et al. |
| 2018/0059458 A1 | 3/2018 | Chen |
| 2018/0088260 A1 | 3/2018 | Jin et al. |
| 2018/0097043 A1 | 4/2018 | Song |
| 2018/0175121 A1 | 6/2018 | Ji et al. |
| 2018/0190733 A1 | 7/2018 | Hsu et al. |
| 2018/0247984 A1 | 8/2018 | Wang et al. |
| 2018/0308412 A1 | 10/2018 | Wu et al. |
| 2018/0308907 A1 | 10/2018 | Jin et al. |
| 2018/0355466 A1 | 12/2018 | Mu |
| 2019/0011830 A1 | 1/2019 | Ji |
| 2019/0035859 A1 | 1/2019 | Kang et al. |
| 2019/0035869 A1 | 1/2019 | Kang et al. |
| 2019/0066564 A1 | 2/2019 | Tan |
| 2019/0073941 A1 | 3/2019 | Xi et al. |
| 2019/0081113 A1 | 3/2019 | Gu et al. |
| 2019/0096962 A1 | 3/2019 | Han et al. |
| 2019/0115399 A1 | 4/2019 | Jo et al. |
| 2019/0131589 A1 | 5/2019 | Matsueda et al. |
| 2019/0139153 A1 | 5/2019 | Su et al. |
| 2019/0140030 A1 | 5/2019 | Huangfu et al. |
| 2019/0206341 A1 | 7/2019 | Liao et al. |
| 2019/0237518 A1 | 8/2019 | Sun et al. |
| 2019/0296093 A1 | 9/2019 | Liu et al. |
| 2019/0326365 A1 | 10/2019 | Jin et al. |
| 2019/0340970 A1 | 11/2019 | Kirisken |
| 2019/0371269 A1 | 12/2019 | Matsueda |
| 2019/0385534 A1 | 12/2019 | Park |
| 2020/0013833 A1 | 1/2020 | Wang et al. |
| 2020/0035172 A1 | 1/2020 | Chen |
| 2020/0043990 A1 | 2/2020 | Huangfu et al. |
| 2020/0119107 A1 | 4/2020 | Liu et al. |
| 2020/0152712 A1 | 5/2020 | Chung et al. |
| 2020/0152726 A1 | 5/2020 | Hong et al. |
| 2020/0176524 A1 | 6/2020 | Jo et al. |
| 2020/0258441 A1 | 8/2020 | Zhang et al. |
| 2020/0312942 A1 | 10/2020 | Yang et al. |
| 2020/0328259 A1 | 10/2020 | Joe |
| 2020/0357325 A1 | 11/2020 | Zhao et al. |
| 2020/0357862 A1 | 11/2020 | Wang et al. |
| 2020/0365070 A1 | 11/2020 | Jeong et al. |
| 2020/0365085 A1 | 11/2020 | Yang et al. |
| 2021/0027679 A1 | 1/2021 | Kwon et al. |
| 2021/0035484 A1 | 2/2021 | Matsued et al. |
| 2021/0091145 A1 | 3/2021 | Huangfu et al. |
| 2021/0335297 A1 | 10/2021 | Huangfu et al. |
| 2022/0028348 A1 | 1/2022 | Huangfu et al. |

FOREIGN PATENT DOCUMENTS

| | | |
|---|---|---|
| CN | 102201430 A | 9/2011 |
| CN | 101582241 B | 10/2011 |
| CN | 103681754 A | 3/2014 |
| CN | 103777393 A | 5/2014 |
| CN | 104051493 A | 9/2014 |
| CN | 104465714 A | 12/2014 |
| CN | 104269411 A | 1/2015 |
| CN | 104282727 A | 1/2015 |
| CN | 104332486 A | 2/2015 |
| CN | 104377229 A | 2/2015 |
| CN | 104576695 A | 4/2015 |
| CN | 104597655 A | 5/2015 |
| CN | 104637987 A | 5/2015 |
| CN | 104701341 A | 6/2015 |
| CN | 104835832 A | 8/2015 |
| CN | 104882464 A | 9/2015 |
| CN | 204991022 A | 1/2016 |
| CN | 204991023 U | 1/2016 |
| CN | 205231065 U | 5/2016 |
| CN | 205355055 U | 6/2016 |
| CN | 105789253 A | 7/2016 |
| CN | 105826349 A | 8/2016 |
| CN | 205845956 U | 12/2016 |
| CN | 106293244 A | 1/2017 |
| CN | 106298865 A | 1/2017 |
| CN | 106601167 A | 4/2017 |
| CN | 106782307 A | 5/2017 |
| CN | 206163494 U | 5/2017 |
| CN | 106935630 A | 7/2017 |
| CN | 107248378 A | 10/2017 |
| CN | 107256695 A | 10/2017 |
| CN | 107275359 A | 10/2017 |
| CN | 107481671 A | 12/2017 |
| CN | 107644888 A | 1/2018 |
| CN | 107665684 A | 2/2018 |
| CN | 105280139 B | 5/2018 |
| CN | 207781607 U | 8/2018 |
| CN | 207781608 U | 8/2018 |
| CN | 207883217 U | 9/2018 |
| CN | 208172438 U | 11/2018 |
| CN | 208172439 U | 11/2018 |
| CN | 109491158 A | 3/2019 |
| CN | 109559679 A | 4/2019 |
| CN | 109891487 A | 6/2019 |
| CN | 110010021 A | 7/2019 |
| EP | 2423911 A2 | 2/2012 |
| EP | 2680310 A1 | 1/2014 |
| EP | 2709155 A1 | 3/2014 |
| EP | 3751611 A1 | 12/2020 |
| IN | 107393468 A | 11/2017 |
| JP | 2002221917 A | 8/2002 |
| JP | 2005-62416 A | 3/2005 |
| JP | 2005091875 A | 4/2005 |
| JP | 2008015521 A | 1/2008 |
| JP | 2008-225179 A | 9/2008 |
| JP | 2009-533810 A | 9/2009 |
| JP | 2014-225329 A | 12/2014 |
| JP | 2015-138955 A | 7/2015 |
| JP | 2016-75868 A | 5/2016 |
| JP | 2016-91918 A | 5/2016 |
| JP | 2016090991 A | 5/2016 |
| JP | 2016-130780 A | 7/2016 |
| JP | 2016-537688 A | 12/2016 |
| JP | 2018-198198 A | 12/2018 |
| KR | 1020090049515 A | 5/2009 |
| KR | 102011018050 A | 10/2011 |
| KR | 1020130101874 A | 9/2013 |
| KR | 101347995 B1 | 1/2014 |
| KR | 1020150006668 A | 1/2015 |
| KR | 20160051511 A | 5/2016 |
| KR | 1020170116556 A | 10/2017 |
| WO | 2007/088656 A1 | 8/2007 |
| WO | 2014/136149 A1 | 9/2014 |
| WO | 2016192241 A1 | 12/2016 |
| WO | 2017140038 A1 | 8/2017 |
| WO | 2018014562 A1 | 1/2018 |
| WO | 2019/153948 A1 | 8/2019 |
| WO | 2019153949 A1 | 8/2019 |
| WO | 2019084932 A1 | 9/2019 |
| WO | 2019134514 A1 | 11/2019 |
| WO | 2019134522 A1 | 11/2019 |
| WO | 2020124693 A1 | 6/2020 |

OTHER PUBLICATIONS

Office Action from U.S. Appl. No. 16/621,904 dated Feb. 10, 2023.
Notice of Allowance from U.S. Appl. No. 17/880,874 dated Mar. 31, 2023.
U.S. Office Action from U.S. Appl. No. 17/497,630 dated May 12, 2022.
Notice of Allowance from U.S. Appl. No. 16/755,970 dated May 6, 2022.
Extended European Search Report from European Application No. 21152119.0 dated May 21, 2011.
Indian Office Action from Indian Patent Application No. 202017026082 dated May 25, 2021.

(56) References Cited

OTHER PUBLICATIONS

Park et al, "Luminance Uniformity of Large Area OLEDs With an Auxiliary Metal Electrode" Journal of Display Technology, vol. 5, No. 8, Aug. 2009.
First Korean Office Action in Korean Patent Application No. 10-2019-7024785 dated Jul. 30, 2020.
Notice of Allowance from U.S. Appl. No. 16/234,777 dated Sep. 1, 2020.
U.S. Office Action from U.S. Appl. No. 16/600,316, filed Oct. 11, 2020.
U.S. Office Action from U.S. Appl. No. 16/621,918, filed Sep. 29, 2020.
U.S. Office Action from U.S. Appl. No. 16/492,930, filed Jul. 24, 2020.
Indian Examination Report for Application No. 202017027785 dated Aug. 19, 2021.
Written Decision of Dismissal of Amendment issued by the Korean Patent Office in the corresponding Korean Patent Application No. 10-2019-7027773 dated Aug. 24, 2021.
Extended European Search Report for Application No. 18905693.0 dated Jan. 10, 2021.
U.S. Non-final Office Action issued by the USPTO in U.S. Appl. No. 16/621,904 dated Aug. 2, 2021.
First Office Action issued by the Chinese Patent Office in the priority Chinese Application No. 201810135947.1 dated Mar. 3, 2020.
Written Decision on Registration issued by the Korean Patent in the Application No. 1020177022698 and its English translation dated Mar. 6, 2020.
International Search Report of PCT/CN2017/07597 dated Nov. 29, 2017.
Extended European Search Report for EP Patent Application No. 17768339.8 dated Jun. 12, 2019.
Indian Office Action of Indian Patent Application No. 201717038562 dated Oct. 15, 2019.
Second Korean Office Action of Korean Patent Application No. 1020177022698 dated May 29, 2019.
First U.S. Office Action for U.S. Appl. No. 15/578,481 dated Feb. 1, 2019.
Second U.S. Office Action for U.S. Appl. No. 15/578,481 dated Jul. 11, 2019.
First U.S. Office Action for U.S. Appl. No. 15/536,347 dated Aug. 28, 2018.
Brown Elliott, Candice Helen; "Reducing Pixel Count without Reducing Image Quality", Information Display, Dec. 1999, p. 22-25.
Fang, "Subpixel Rendering: From Font Rendering to Image Subsampling", IEEE Signal Processing Magazine, May 2013, pp. 177-189.
Messing et al., "Improved Display Resolution of Subsampled Colour Images Using Subpixel Addressing" 2002, pp. 625-628, IEEE ICIP.
Huang, "RGB to RGBG Conversion Algorithm based on Weighting Factors and Related FPGA Realization", Journal, Jul. 2017, pp. 572-579, Chinese Journal of Liquid Crystals and Displays.
Indian Examination Report for Application No. 2020017027785 dated Aug. 19, 2021.
U.S. Office Action from U.S. Appl. No. 16/622,045 dated Dec. 21, 2021.
Extended European Search Report for Application No. 18905189.9 dated Oct. 19, 2021.
Extended European Search Report for Application No. 18903035.6 dated Nov. 8, 2021.
Indian Office Action from Indian Application No. 202027048001 dated Jun. 12, 2021.
Australian Examination Report for Application No. 22103983 dated May 12, 2022.
Office Action dated Nov. 18, 2022 in Japanese Appln. 2020-536078.
Office Action dated Nov. 21, 2022 in Japanese Appln. 2019-543028.
Office Action dated Nov. 24, 2022 in Japanese Appln. 2019-549456.
Office Action dated Dec. 22, 2022 in Japanese Appln. 2020-535989.
Extended Search Report from European Patent Application No. 19933238.8 dated Oct. 18, 2022.
Extended Search Report from European Patent Application No. 19832268.7 dated Oct. 25, 2022.
Non-final Office Action from U.S. Appl. No. 16/483,210, filed Sep. 22, 2021.
Final Office Action from U.S. Appl. No. 16/483,210, filed Feb. 24, 2022.
Notice of Allowance from U.S. Appl. No. 16/483,210 dated May 3, 2022.
International Search Report from International Application No. PCT/CN2018/124404 dated Dec. 27, 2018.
First Office Action from Korean Patent Application No. 10-2019-7027773 dated Dec. 25, 2020.
Japanese Office Action from Japanese Application No. 2017544608 dated Oct. 12, 2020.
Written Opinion From International Application No. PCT/CN2018/124404 dated Dec. 27, 2018.
First Chinese Office Action from Chinese Patent Application No. 201680082630.5 dated Apr. 1, 2022.
First Korean Office Action from Korean Patent Application No. 10-2021-7030323 dated Jan. 25, 2022.
Notice of Allowance from U.S. Appl. No. 16/630,496 dated Mar. 26, 2021.
Notice of Allowance from U.S. Appl. No. 16/600,316 dated Apr. 14, 2021.
Australian Examination Report for Application No. 202103983 dated May 12, 2022.
Office Action issued by the USPTO in corresponding U.S. Appl. No. 17/551,341 dated Apr. 26, 2023.
Office Action issued by the European Patent Office in the corresponding European Patent Application No. 18903035.6; The Office Action has an issue date of Nov. 16, 2023.
Chinese Office Action issued by Chinese Patent Office in the application No. 201810136335.4; The Office Action has an issue date of Nov. 15, 2023.
Office Action issued by the U.S. Patent Office in the corresponding U.S. Appl. No. 17/551,341; The Office Action has an issue date of Sep. 27, 2023.
Chinese Office Action issued by Chinese Patent Office in the application No. 201810137012.7; The Office Action has an issue date of Nov. 30, 2023.
Chinese Office Action issued by Chinese Patent Office in the application No. 201810137016.5; The Office Action has an issue date of Nov. 30, 2023.

* cited by examiner

PIXEL ARRANGEMENT STRUCTURE, DISPLAY METHOD AND PREPARING METHOD OF PIXEL ARRANGEMENT STRUCTURE, AND DISPLAY SUBSTRATE

CROSS REFERENCE TO RELATED APPLICATIONS

This application is the Continuation application of U.S. patent application Ser. No. 16/483,210 filed on Aug. 2, 2019 which is the National Stage of PCT/CN2018/124404 filed on Dec. 27, 2018, which claims priority to and the benefit of Chinese patent application No. 201810136335.4 filed on Feb. 9, 2018. The above-identified applications are incorporated by reference herein in their entirety.

TECHNICAL FIELD

Embodiments of the present disclosure relate to a pixel arrangement structure, a display method and a preparing method of a pixel arrangement structure, and a display substrate.

BACKGROUND

In recent years, display devices widely used mainly include liquid crystal display (LCD) devices and organic light-emitting diode (OLED) display devices. The liquid crystal display devices have advantages such as simple control method, low power consumption, non-radiation and the like, and are widely applied in devices such as displays, televisions, mobile phones, computers, notebook computers and the like. The organic light-emitting diode display devices have advantages such as large visual angle, light weight and thin volume, fast response speed, high luminous and the like, are convenient to realize color display and large screen display, are convenient to realize flexible display, and thus have a wide application prospect.

In display devices, a pixel arrangement structure of a display panel generally includes a plurality of pixel units which are repeatedly arranged. Each of the plurality of pixel units generally includes a red sub-pixel block R, a green sub-pixel block G, and a blue sub-pixel block B, which are arranged in sequence. In a case where different colors need to be displayed, the three sub-pixel blocks respectively emit light with different brightness, and because the size of the three sub-pixel blocks is very small, the three sub-pixel blocks are visually mixed into the required colors.

SUMMARY

At least one embodiment of the present disclosure provides a pixel arrangement structure, which includes: a plurality of first color sub-pixel blocks, a plurality of second color sub-pixel blocks, and a plurality of third color sub-pixel blocks, located in a plurality of minimum repeating regions. Each of the plurality of minimum repeating regions has a rectangular shape and comprises four virtual rectangles, the four virtual rectangles comprise a first virtual rectangle, and the first virtual rectangle comprises one first color sub-pixel block of the plurality of first color sub-pixel blocks, one second color sub-pixel block of the plurality of second color sub-pixel blocks, and one third color sub-pixel block of the plurality of third color sub-pixel blocks; any edge of the first virtual rectangle has a non-zero included angle with a first direction, and the first direction is a row direction or a column direction; and the first virtual rectangle comprises a first edge and a second edge perpendicular to each other, the first color sub-pixel block is on a perpendicular bisector of the first edge, the second color sub-pixel block and the third color sub-pixel block are on different sides of the perpendicular bisector of the first edge, and a distance between the second color sub-pixel block and the first edge and a distance between the third color sub-pixel block and the first edge are both smaller than a distance between the first color sub-pixel block and the first edge.

For example, in the pixel arrangement structure provided by an embodiment of the present disclosure, the non-zero included angle between any edge of the first virtual rectangle and the first direction ranges from 10 degrees to 50 degrees.

For example, in the pixel arrangement structure provided by an embodiment of the present disclosure, a center of the first color sub-pixel block is on the perpendicular bisector of the first edge, the second color sub-pixel block and the third color sub-pixel block are on different sides of the perpendicular bisector of the first edge, and a distance between a center of the second color sub-pixel block and the first edge and a distance between a center of the third color sub-pixel block and the first edge are both smaller than a distance between the center of the first color sub-pixel block and the first edge.

For example, in the pixel arrangement structure provided by an embodiment of the present disclosure, the four virtual rectangles further comprise a second virtual rectangle, a third virtual rectangle, and a fourth virtual rectangle, and the first virtual rectangle, the second virtual rectangle, the third virtual rectangle, and the fourth virtual rectangle form a 2*2 matrix in an edge-sharing manner to form one of the plurality of minimum repeating regions, the second virtual rectangle shares the first edge with the first virtual rectangle, and is mirror-symmetrical with the first virtual rectangle with respect to the first edge. The first virtual rectangle coincides with the third virtual rectangle by shifting a distance of a length of a diagonal line of the first virtual rectangle along the diagonal line, and the third virtual rectangle is adjacent to the second virtual rectangle, the third virtual rectangle comprises a third edge, the fourth virtual rectangle shares the third edge with the third virtual rectangle, and is mirror-symmetrical with the third virtual rectangle with respect to the third edge, and the third edge and the first edge are in a same straight line.

For example, in the pixel arrangement structure provided by an embodiment of the present disclosure, the first color sub-pixel block is a green sub-pixel block, the second color sub-pixel block is a red sub-pixel block, and the third color sub-pixel block is a blue sub-pixel block.

For example, in the pixel arrangement structure provided by an embodiment of the present disclosure, a shape of the first color sub-pixel block is a symmetrical pentagon having a base angle of a right angle, the symmetrical pentagon having the base angle of the right angle is symmetrical with respect to the perpendicular bisector of the first edge, and a base of the symmetrical pentagon having the base angle of the right angle is parallel to the first edge, and is further away from the first edge compared to a vertex of the symmetrical pentagon having the base angle of the right angle in a direction perpendicular to the first edge.

For example, in the pixel arrangement structure provided by an embodiment of the present disclosure, a shape of the second color sub-pixel block and/or the third color sub-pixel block is a symmetrical pentagon having a base angle of a right angle, and a base of the symmetrical pentagon having the base angle of the right angle is parallel to or located on the first edge, and is closer to the first edge compared to a vertex of the symmetrical pentagon having the base angle of the right angle in a direction perpendicular to the first edge.

For example, in the pixel arrangement structure provided by an embodiment of the present disclosure, shapes of the second color sub-pixel block and the third color sub-pixel block are both pentagons having a base angle of a right angle, bases of the pentagons having the base angle of the right angle are parallel to or located on the first edge, and are closer to the first edge compared to vertexes of the pentagons having the base angle of the right angle in a direction perpendicular to the first edge, each of the pentagons having the base angle of the right angle comprises a first bevel edge and a second bevel edge passing through a vertex, the first bevel edge is opposite to the first color sub-pixel block in a same one of the virtual rectangles, and a length of the first bevel edge is larger than a length of the second bevel edge.

For example, in the pixel arrangement structure provided by an embodiment of the present disclosure, a shape of the first color sub-pixel block is a symmetrical pentagon having a base angle of a right angle, the symmetrical pentagon having the base angle of the right angle is symmetrical with respect to the perpendicular bisector of the first edge, and a base of the symmetrical pentagon having the base angle of the right angle is parallel to the first edge, and is further away from the first edge compared to a vertex of the symmetrical pentagon having the base angle of the right angle in a direction perpendicular to the first edge; and the symmetrical pentagon having the base angle of the right angle comprises a third bevel edge and a fourth bevel edge passing through the vertex of the symmetrical pentagon having the base angle of the right angle, a length of the third bevel edge and a length of the fourth bevel edge are identical, the third bevel edge of the first color sub-pixel block is parallel to the first bevel edge of the second color sub-pixel block in the same one of the virtual rectangles and has a spacing of a first distance, and the fourth bevel edge of the first color sub-pixel block is parallel to the first bevel edge of the third color sub-pixel block in the same one of the virtual rectangles and has a spacing of a second distance.

For example, in the pixel arrangement structure provided by an embodiment of the present disclosure, in the first virtual rectangle and the second virtual rectangle, the second color sub-pixel block is further away from a center of a corresponding minimum repeating region compared to the third color sub-pixel block, and, in the third virtual rectangle and the fourth virtual rectangle, the third color sub-pixel block is further away from the center of the corresponding minimum repeating region compared to the second color sub-pixel block, the third color sub-pixel block in the first virtual rectangle is adjacent to the second color sub-pixel block in the fourth virtual rectangle, the third color sub-pixel block in the second virtual rectangle is adjacent to the second color sub-pixel block in the third virtual rectangle, the second bevel edge of the third color sub-pixel block in the first virtual rectangle is parallel to the second bevel edge of the second color sub-pixel block in the fourth virtual rectangle and has a spacing of a third distance, and the second bevel edge of the third color sub-pixel block in the second virtual rectangle is parallel to the second bevel edge of the second color sub-pixel block in the third virtual rectangle and has a spacing of a fourth distance.

For example, in the pixel arrangement structure provided by an embodiment of the present disclosure, the first distance, the second distance, the third distance, and the fourth distance are all equal.

For example, in the pixel arrangement structure provided by an embodiment of the present disclosure, shapes of the second color sub-pixel block and the third color sub-pixel block are right-angle trapezoids, bases of the right-angle trapezoids are perpendicular to the first edge, and a distance between a right-angle edge of each of the right-angle trapezoids and the first edge is smaller than a distance between a bevel edge of each of the right-angle trapezoids and the first edge.

For example, in the pixel arrangement structure provided by an embodiment of the present disclosure, a shape of the first color sub-pixel block is a symmetrical pentagon having a base angle of a right angle, the symmetrical pentagon having the base angle of the right angle is symmetrical with respect to the perpendicular bisector of the first edge, a base of the symmetrical pentagon having the base angle of the right angle is parallel to the first edge, and is further away from the first edge compared to a vertex of the symmetrical pentagon having the base angle of the right angle in a direction perpendicular to the first edge, the symmetrical pentagon having the base angle of the right angle comprises a third bevel edge and a fourth bevel edge passing through the vertex of the symmetrical pentagon having the base angle of the right angle, a length of the third bevel edge and a length of the fourth bevel edge are identical, the third bevel edge of the first color sub-pixel block is parallel to the bevel edge of the second color sub-pixel block in a same one of the virtual rectangles and has a spacing of a fifth distance, and the fourth bevel edge of the first color sub-pixel block is parallel to the bevel edge of the third color sub-pixel block in the same one of the virtual rectangles and has a spacing of a sixth distance.

For example, in the pixel arrangement structure provided by an embodiment of the present disclosure, in the first virtual rectangle and the second virtual rectangle, the third color sub-pixel block is closer to a center of a corresponding minimum repeating region compared to the second color sub-pixel block, and, in the third virtual rectangle and the fourth virtual rectangle, the second color sub-pixel block is closer to the center of the corresponding minimum repeating region compared to the third color sub-pixel block, the third color sub-pixel block in the first virtual rectangle is adjacent to the second color sub-pixel block in the fourth virtual rectangle, the third color sub-pixel block in the second virtual rectangle is adjacent to the second color sub-pixel block in the third virtual rectangle, an acute-angle portion of the third color sub-pixel block in the first virtual rectangle and an acute-angle portion of the second color sub-pixel block in the fourth virtual rectangle have a spacing of a seventh distance, and an acute-angle portion of the third color sub-pixel block in the second virtual rectangle and an acute-angle portion of the second color sub-pixel block in the third virtual rectangle have a spacing of an eighth distance.

For example, in the pixel arrangement structure provided by an embodiment of the present disclosure, the fifth distance, the sixth distance, the seventh distance, and the eighth distance are all equal.

For example, in the pixel arrangement structure provided by an embodiment of the present disclosure, a distance between a center of the first color sub-pixel block and the first edge is greater than or equal to half of a length of the second edge and less than or equal to three quarters of the length of the second edge.

For example, in the pixel arrangement structure provided by an embodiment of the present disclosure, in a same one of the plurality of minimum repeating regions, a center distance between the first color sub-pixel block in the third virtual rectangle and the first color sub-pixel block in the fourth virtual rectangle is greater than or equal to half of a length of the second edge and less than or equal to the length of the second edge.

For example, in the pixel arrangement structure provided by an embodiment of the present disclosure, in a same one of the plurality of minimum repeating regions, the second color sub-pixel block of the first virtual rectangle and the second color sub-pixel block of the second virtual rectangle are integrated into a same sub-pixel and display together as a whole, in two adjacent ones of the plurality of minimum repeating regions in a direction perpendicular to the first edge, the two adjacent ones of the plurality of minimum repeating regions comprise a first minimum repeating region and a second minimum repeating region, the fourth virtual rectangle in the first minimum repeating region and the third virtual rectangle in the second minimum repeating region are adjacent, and the second color sub-pixel block of the fourth virtual rectangle in the first minimum repeating region and the second color sub-pixel block of the third virtual rectangle in the second minimum repeating region are integrated into a same sub-pixel and display together as a whole.

For example, in the pixel arrangement structure provided by an embodiment of the present disclosure, in the same one of the plurality of minimum repeating regions, the third color sub-pixel block of the first virtual rectangle and the third color sub-pixel block of the second virtual rectangle are integrated into a same sub-pixel and display together as a whole, in the two adjacent ones of the plurality of minimum repeating regions in the direction perpendicular to the first edge, the two adjacent ones of the plurality of minimum repeating regions comprise the first minimum repeating region and the second minimum repeating region, the fourth virtual rectangle in the first minimum repeating region and the third virtual rectangle in the second minimum repeating region are adjacent, and the third color sub-pixel block of the fourth virtual rectangle in the first minimum repeating region and the third color sub-pixel block of the third virtual rectangle in the second minimum repeating region are integrated into a same sub-pixel and display together as a whole.

For example, in the pixel arrangement structure provided by an embodiment of the present disclosure, the pixel arrangement structure forms a rectangular arrangement region, and an included angle between any edge of the rectangular arrangement region and any edge of the first virtual rectangle is 45 degrees.

For example, in the pixel arrangement structure provided by an embodiment of the present disclosure, the first direction is parallel to or perpendicular to an extending direction of a driving line driving the pixel arrangement structure.

At least one embodiment of the present disclosure further provides a pixel arrangement structure, which includes: a plurality of first color sub-pixel block, a plurality of second color sub-pixel blocks, and a plurality of third color sub-pixel block, located in a plurality of minimum repeating regions. Each of the plurality of minimum repeating regions has a rectangular shape and comprises four virtual rectangles, the four virtual rectangles comprise a first virtual rectangle, and the first virtual rectangle comprises one first color sub-pixel block of the plurality of first color sub-pixel blocks, one second color sub-pixel block of the plurality of second color sub-pixel blocks and one third color sub-pixel block of the plurality of third color sub-pixel blocks, the pixel arrangement structure forms a rectangular arrangement region, any edge of the first virtual rectangle has an non-zero included angle with any edge of the rectangular arrangement region, the first virtual rectangle comprises a first edge and a second edge perpendicular to each other, the first color sub-pixel block is on a perpendicular bisector of the first edge, the second color sub-pixel block and the third color sub-pixel block are on different sides of the perpendicular bisector of the first edge, and a distance between the second color sub-pixel block and the first edge and a distance between the third color sub-pixel block and the first edge are both smaller than a distance between the first color sub-pixel block and the first edge.

At least one embodiment of the present disclosure further provides a display substrate, which includes a base substrate and a plurality of pixels on the base substrate, and the plurality of pixels adopt the pixel arrangement structure according to any one of the above examples.

For example, in the display substrate provided by an embodiment of the present disclosure, the four virtual rectangles further comprise a second virtual rectangle, a third virtual rectangle, and a fourth virtual rectangle, and the first virtual rectangle, the second virtual rectangle, the third virtual rectangle, and the fourth virtual rectangle form a 2*2 matrix in an edge-sharing manner to form one of the plurality of minimum repeating regions, the second virtual rectangle shares the first edge with the first virtual rectangle, and is mirror-symmetrical with the first virtual rectangle with respect to the first edge; the first virtual rectangle coincides with the third virtual rectangle by shifting a distance of a length of a diagonal line of the first virtual rectangle along the diagonal line, and the third virtual rectangle is adjacent to the second virtual rectangle, the third virtual rectangle comprises a third edge, the fourth virtual rectangle shares the third edge with the third virtual rectangle, and is mirror-symmetrical with the third virtual rectangle with respect to the third edge, and the third edge and the first edge are in a same straight line, the first color sub-pixel block comprises a first color pixel electrode and a first color light emitting layer on the first color pixel electrode, the second color sub-pixel block comprises a second color pixel electrode and a second color light emitting layer on the second color pixel electrode, the third color sub-pixel block comprises a third color pixel electrode and a third color light emitting layer on the third color pixel electrode, the first color pixel electrode is configured to drive the first color light emitting layer to emit light, the second color pixel electrode is configured to drive the second color light emitting layer to emit light, and the third color pixel electrode is configured to drive the third color light emitting layer to emit light.

For example, in the display substrate provided by an embodiment of the present disclosure, in a same one of the plurality of minimum repeating regions, the first color light emitting layer of the first color sub-pixel block of the third virtual rectangle and the first color light emitting layer of the first color sub-pixel block of the fourth virtual rectangle are formed by sharing a same single color pattern region, in two adjacent ones of the plurality of minimum repeating regions in a direction perpendicular to the first edge, the two adjacent ones of the plurality of minimum repeating regions comprise a first minimum repeating region and a second minimum repeating region, and the first color light emitting layer of the first color sub-pixel block of the first virtual rectangle in the first minimum repeating region and the first color light emitting layer of the first color sub-pixel block of the second virtual rectangle in the second minimum repeating region are formed by sharing a same single color pattern region.

For example, in the display substrate provided by an embodiment of the present disclosure, in the same one of the plurality of minimum repeating regions, an area of the first color light emitting layer of the first color sub-pixel block of the third virtual rectangle and the first color light emitting layer of the first color sub-pixel block of the fourth virtual rectangle formed by sharing the same single color pattern region is larger than a sum of an area of the first color pixel electrode of the first color sub-pixel block of the third virtual rectangle and an area of the first color pixel electrode of the first color sub-pixel block of the fourth virtual rectangle, in the two adjacent ones of the plurality of minimum repeating regions in the direction perpendicular to the first edge, the two adjacent ones of the plurality of minimum repeating regions comprise the first minimum repeating region and the second minimum repeating region, an area of the first color light emitting layer of the first color sub-pixel block of the first virtual rectangle in the first minimum repeating region and the first color light emitting layer of the first color sub-pixel block of the second virtual rectangle in the second minimum repeating region formed by sharing the same single color pattern region is larger than a sum of an area of the first color pixel electrode of the first color sub-pixel block of the first virtual rectangle in the first minimum repeating region and an area of the first color pixel electrode of the first color sub-pixel block of the second virtual rectangle in the second minimum repeating region.

For example, in the display substrate provided by an embodiment of the present disclosure, in a same one of the plurality of minimum repeating regions, the second color pixel electrode of the second color sub-pixel block of the first virtual rectangle and the second color pixel electrode of the second color sub-pixel block of the second virtual rectangle are integrated into a same pixel electrode, in two adjacent ones of the plurality of minimum repeating regions in a direction perpendicular to the first edge, the two adjacent ones of the plurality of minimum repeating regions comprise a first minimum repeating region and a second minimum repeating region, and the second color pixel electrode of the second color sub-pixel block of the fourth virtual rectangle in the first minimum repeating region and the second color pixel electrode of the second color sub-pixel block of the third virtual rectangle in the second minimum repeating region are integrated into a same pixel electrode.

For example, in the display substrate provided by an embodiment of the present disclosure, in a same one of the plurality of minimum repeating regions, the third color pixel electrode of the third color sub-pixel block of the first virtual rectangle and the third color pixel electrode of the third color sub-pixel block of the second virtual rectangle are integrated into a same pixel electrode, in two adjacent ones of the plurality of minimum repeating regions in a direction perpendicular to the first edge, the two adjacent ones of the plurality of minimum repeating regions comprise a first minimum repeating region and a second minimum repeating region, and the third color pixel electrode of the third color sub-pixel block of the fourth virtual rectangle in the first minimum repeating region and the third color pixel electrode of the third color sub-pixel block of the third virtual rectangle in the second minimum repeating region are integrated into a same pixel electrode.

For example, in the display substrate provided by an embodiment of the present disclosure, the first color sub-pixel block comprises a first color filter, the second color sub-pixel block comprises a second color filter, and the third color sub-pixel block comprises a third color filter.

At least one embodiment of the present disclosure further provides a display method for the pixel arrangement structure according to any one of the above examples, which includes: connecting a plurality of virtual lines crossing each other passing through the plurality of first color sub-pixel blocks along the first direction and a direction perpendicular to the first direction, and determining cross points of the virtual lines as virtual pixel points; allocating display data to the virtual pixel points; and calculating display data of sub-pixel blocks in a corresponding virtual rectangle according to the display data of two of the virtual pixel points adjacent to each of the virtual rectangles.

For example, in the display method provided by an embodiment of the present disclosure, in two adjacent ones of the virtual rectangles in a direction perpendicular to the first edge, two of the virtual pixel points corresponding to one of the two adjacent ones of the virtual rectangles are located in the first direction, and two of the virtual pixel points corresponding to the other one of the two adjacent ones of the virtual rectangles are located in a direction perpendicular to the first direction.

For example, in the display method provided by an embodiment of the present disclosure, calculating the display data of the sub-pixel blocks in the corresponding virtual rectangle according to the display data of two of the virtual pixel points adjacent to each of the virtual rectangles comprises: calculating the display data of the sub-pixel blocks in the corresponding virtual rectangle by an interpolation method.

At least one embodiment of the present disclosure further provides a preparing method of the pixel arrangement structure according to any one of the above examples, which includes: performing an evaporating process on an array substrate by using a fine metal mask plate to form the pixel arrangement structure, a net stretching direction of the fine metal mask plate and the first direction have a non-zero included angle.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

Figure 1:
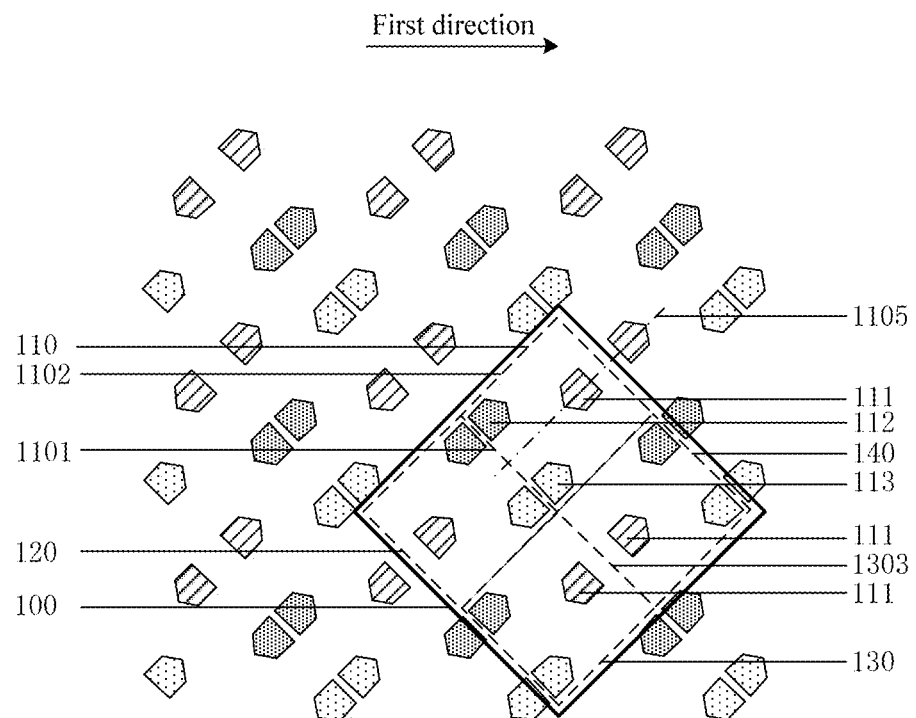
FIG. 1 is a schematic diagram of a pixel arrangement structure provided by an embodiment of the present disclosure.

In order to make objects, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

With development of technologies, requirements for the resolution of display devices become higher and higher. In a case where the display device needs to realize high-resolution display, number of pixels required is large. Usually, the resolution of the display device is improved by reducing the size of pixels and the spacing between adjacent pixels. Therefore, with the continuous refinement of process technology, the process difficulty and manufacturing costs of the display device also increase correspondingly.

Due to the limitation of fine metal mask (FMM) technology, it is very difficult to manufacture a display device with high-resolution. At present, it is very difficult for the FMM technology to implement a resolution higher than 300 pixels per inch (PPI). Therefore, some methods are proposed to reduce the FMM process difficulty by adjusting the relative positions of RGB sub-pixel blocks. However, when such pixel arrangement being used for display, due to the difference in the numbers of pixels of each color in the horizontal direction and/or the vertical direction, a color edge (e.g., a red edge or a blue edge) in the horizontal direction (X direction) and the vertical direction (Y direction) may appear on an edge of the picture, thus affecting the display quality.

At least one embodiment of the present disclosure provides a pixel arrangement structure, a display method and a preparing method of a pixel arrangement structure, and a display substrate. The pixel arrangement structure can balance the distribution of RGB sub-pixel blocks, avoid the color edge at the edge of the picture, help to improve the display quality, and achieve real pixel display with a resolution of 300 PPI or slightly higher.

Hereinafter, embodiments of the present disclosure are described in detail with reference to the accompanying drawings. It should be noted that the same reference numerals in different drawings are used to refer to the same elements already described.

At least one embodiment of the present disclosure provides a pixel arrangement structure. The pixel arrangement structure includes a plurality of first color sub-pixel blocks, a plurality of second color sub-pixel blocks, and a plurality of third color sub-pixel blocks, located in a plurality of minimum repeating regions. Each of the plurality of minimum repeating regions has a rectangular shape and includes four virtual rectangles; the four virtual rectangles include a first virtual rectangle, and the first virtual rectangle includes one first color sub-pixel block of the plurality of first color sub-pixel blocks, one second color sub-pixel block of the plurality of second color sub-pixel blocks, and one third color sub-pixel block of the plurality of third color sub-pixel blocks. Any edge of the first virtual rectangle has a non-zero included angle with a first direction, and the first direction is a row direction or a column direction. The first virtual rectangle includes a first edge and a second edge perpendicular to each other, the first color sub-pixel block is on a perpendicular bisector of the first edge, the second color sub-pixel block and the third color sub-pixel block are on different sides of the perpendicular bisector of the first edge, and a distance between the second color sub-pixel block and the first edge and a distance between the third color sub-pixel block and the first edge are both smaller than a distance between the first color sub-pixel block and the first edge.

FIG. 1 is a schematic diagram of a pixel arrangement structure according to an embodiment of the present disclosure. Referring to FIG. 1, a plurality of first color sub-pixel blocks 111, a plurality of second color sub-pixel blocks 112, and a plurality of third color sub-pixel blocks 113 are located in a plurality of minimum repeating regions 100. For example, the plurality of minimum repeating regions 100 are in a repeating arrangement. For example, the repeating arrangement refers to repeating arrangement of sub-pixel blocks in the minimum repeating region 100 without drive lines or other components, and the drive lines or other components in different minimum repeating regions 100 may be identical or different. For example, repeating arrangement of sub-pixel blocks means that the positions, shapes, sizes and other characteristics of the sub-pixel blocks are similar, rather than absolutely the same. For example, in some embodiments, the shapes of the sub-pixel blocks may be slightly different for the requirements on wiring or opening. For example, each of the plurality of minimum repeating regions 100 has a rectangular shape (e.g., a square shape). For example, each of the plurality of minimum repeating region 100 includes four virtual rectangles, namely, a first virtual rectangle 110, a second virtual rectangle 120, a third virtual rectangle 130, and a fourth virtual rectangle 140. Any edge of each virtual rectangle has a non-zero included angle with a first direction. For example, the included angle between any edge of each virtual rectangle and the first direction ranges from 10 degrees to 50 degrees. Of course, the embodiments of the present disclosure are not limited thereto, and the included angle between any edge of each virtual rectangle and the first direction may ranges from 40 degrees to 50 degrees, or even be 45 degrees. Through the above angle setting, the color edge at the edge of the picture and a phenomenon of jaggies in the horizontal direction or the vertical direction when some pictures are displayed can be better eliminated.

In a case where the included angle ranges from 40 degrees to 50 degrees (including 40 degrees), it is beneficial to alleviate the phenomenon of color edge or jaggies appearing on the edges of the display picture parallel to the first direction and the edges of the display picture perpendicular to the first direction, and reduce a recognition degree of human eyes, thus ensuring the display picture in both the horizontal direction and the vertical direction. In a case where the included angle is 45 degrees, the color edge appearing at the edge of the picture can be better eliminated, so that the edge of the picture parallel to the first direction and the edge of the picture perpendicular to the first direction both have better display effects. In a case where the included angle ranges from 10 degrees to 40 degrees (excluding 40 degrees), it can be more conducive to eliminating color edge or jaggies appearing on the edge of the display picture parallel to the first direction or the edge of the display picture perpendicular to the first direction, and can be suitable for displaying specific pictures, multi-frame pictures with lower variation frequency or still one frame picture, etc., thus meeting the specific needs of users. For example, in order to adjust a brightness center of the display panel and improve non-uniformity of the brightness distribution of the display panel along a certain direction, the angle of the included angle can also be determined within the above-mentioned angle ranges according to the requirements, thus being beneficial to improving the uniformity of the brightness distribution of the display panel.

In other embodiments of the present disclosure, the included angle between any edge of each virtual rectangle and the first direction may be, for example, 30 degrees, 20 degrees, 15 degrees, 10 degrees, etc., to adjust the distribution of the brightness center and optimize the display in some specific directions, such as the horizontal direction or the vertical direction.

For example, the first direction is a row direction or a column direction. For example, the row direction is a row direction specified for matrix display, or the column direction is a column direction specified for matrix display. In a case where the pixel arrangement structure is applied in a display panel, the first direction is, for example, parallel to or perpendicular to an extending direction of drive lines for driving the pixel arrangement structure on the display panel. For example, the first direction is parallel to or perpendicular to a horizontal direction when the display panel is viewed by human eyes, and thus, an angle of any edge of each virtual rectangle may be 45 degrees obliquely. For example, the "obliquely" herein refers to a direction inclined with respect to the horizontal direction or the vertical direction in the viewing plane. For another example, when a display region of the display panel is rectangular, any edge of each virtual rectangle has an included angle with any edge of the display region, and for example, the included angle is 45 degrees.

The first virtual rectangle 110, the second virtual rectangle 120, the third virtual rectangle 130, and the fourth virtual rectangle 140 form a 2*2 matrix in an edge-sharing manner to form one of the plurality of minimum repeating regions 100. Herein, the "edge-sharing" means that two adjacent virtual rectangles are adjacent to each other and have an overlapping edge. The first virtual rectangle 110 includes a first edge 1101 and a second edge 1102 that are perpendicular to each other.

The second virtual rectangle 120 shares the first edge 1101 with the first virtual rectangle 110, and the second virtual rectangle 120 is mirror-symmetrical with the first virtual rectangle 110 with respect to the first edge 1101. For example, in the description of the present disclosure, the description that the two virtual rectangles are mirror-symmetrical means that the virtual rectangles and sub-pixel blocks in the virtual rectangles are mirror-symmetrical. The first virtual rectangle 110 coincides with the third virtual rectangle 130 by shifting a distance of a length of a diagonal line of the first virtual rectangle 110 along the diagonal line, and the third virtual rectangle 130 is adjacent to the second virtual rectangle 120. For example, in the description of the present disclosure, the description that two virtual rectangles coincide with each other means that both the virtual rectangles and the sub-pixel blocks within the virtual rectangles coincide with each other. The third virtual rectangle 130 includes a third edge 1303, the fourth virtual rectangle 140 shares the third edge 1303 with the third virtual rectangle 130, and is mirror-symmetrical with the third virtual rectangle 130 with respect to the third edge 1303, and the third edge 1303 and the first edge 1101 are in a same straight line.

The first virtual rectangle 110 includes a first color sub-pixel block 111, a second color sub-pixel block 112, and a third color sub-pixel block 113. For example, the first color sub-pixel block 111, the second color sub-pixel block 112, and the third color sub-pixel block 113 constitute a first pixel unit. Similarly, the first color sub-pixel blocks 111, the second color sub-pixel blocks 112, and the third color sub-pixel blocks 113 in the second virtual rectangle 120, the third virtual rectangle 130, and the fourth virtual rectangle 140 constitute a second pixel unit, a third pixel unit, and a fourth pixel unit, respectively.

The first color sub-pixel block 111 (e.g., a center of the first color sub-pixel block 111) is on a perpendicular bisector 1105 of the first edge 1101. The second color sub-pixel block 112 and the third color sub-pixel block 113 are on different sides of the perpendicular bisector 1105 of the first edge 1101. A distance between the second color sub-pixel block 112 (e.g., a center of the second color sub-pixel block 112) and the first edge 1101 and a distance between the third color sub-pixel block 113 (e.g., a center of the third color sub-pixel block 113) and the first edge 1101 are both smaller than a distance between the first color sub-pixel block 111 (e.g., the center of the first color sub-pixel block 111) and the first edge 1101. That is, in the extending direction of the perpendicular bisector 1105, the second color sub-pixel block 112 and the third color sub-pixel block 113 are closer to the first edge 1101 compared to the first color sub-pixel block 111. For example, the second color sub-pixel block 112 and the third color sub-pixel block 113 are mirror-symmetrical with respect to the perpendicular bisector 1105, which can make the distribution of the sub-pixel blocks more uniform. For example, the second color sub-pixel block 112 and the third color sub-pixel block 113 are located at positions near to two ends of the first edge 1101, which can make the distance between the second color sub-pixel block 112 and the third color sub-pixel block 113 larger and facilitate the manufacture. For example, edge distances between any two of the first color sub-pixel block 111, the second color sub-pixel block 112, and the third color sub-pixel block 113 are equal to each other to make the distribution of the pixel arrangement structure more uniform. For example, in the description of the present disclosure, the center of the sub-pixel block refers to a brightness center or a color center of the sub-pixel block. For example, the center of the sub-pixel block may also be a geometric center of a pattern of the sub-pixel block.

It should be noted that, when the pixel arrangement structure is designed, each of the sub-pixels (i.e., each of the above sub-pixel blocks) is generally designed into a regular shape, such as hexagon, pentagon, trapezoid or other shapes. When designing, the center of the sub-pixel can be a geometric center of the above regular shape. However, in the actual manufacturing process, the shape of the formed sub-pixel may generally deviate from the designed regular shape. For example, the corners of the above regular shape may become rounded corners, so the shape of the sub-pixel may be a pattern with rounded corners. In addition, the shape of the actually manufactured sub-pixel may also have other changes with the designed shape. For example, the shape of the sub-pixel designed as a hexagon may become an approximate elliptical shape in the actual manufacturing process. Therefore, the center of the sub-pixel may not be the strict geometric center of the irregular shape of the formed sub-pixel. In the embodiments of the present disclosure, the center of the sub-pixel may have a certain offset from the geometric center of the shape of the sub-pixel. The center of the sub-pixel refers to any point in an area bounded by specific points on radiation line segments each of which starts from the geometric center of the sub-pixel to a point on an edge of the sub-pixel, and each of the specific points is located on a corresponding radiation line segment at location ⅓ of length of the radiation line segment from the geometric center. The definition of the center of the sub-pixel is applicable to the center of the sub-pixel having the regular shape, and is also applicable to the center of the sub-pixel having the irregular shape.

As mentioned above, a shape of an actual fabricated sub-pixel may deviate from the designed sub-pixel shape because of various manufacturing errors. Therefore, in the present disclosure, there may be a certain error about a position of the center of the sub-pixel and a relationship between the positions of the sub-pixel center and other objects. For example, assuming that a line connecting the centers of the sub-pixels or a line passing through the centers of the sub-pixels satisfies other corresponding definitions (for example, the extending direction), the lines may pass through the area bounded by the above-mentioned specific points of the radiation line segments. For another example, the center of the sub-pixel is on a certain line, which means that the line may pass through the area bounded by the above-mentioned specific points of the radiation line segments. In addition, the "coincidence" described in the present disclosure means that at least 70% of areas of the corresponding sub-pixels or other components can be overlapped. The "mirror—symmetrical" described in the present disclosure means that after the mirroring operation, areas of the corresponding sub-pixels can be overlapped by at least 70%.

For example, in a same minimum repeating region (e.g., in the minimum repeating region 100), a center distance between the first color sub-pixel block 111 in the third virtual rectangle 130 and the first color sub-pixel block 111 in the fourth virtual rectangle 140 is S, then 0.5 h≤S≤h, where h is a length of the second edge 1102. For example, assuming that the distance between the center of the first color sub-pixel block 111 and the first edge 1101 is L, then 0.5 h≤L0.75 h, and his the length of the second edge 1102. In this way, the distribution of the first color sub-pixel blocks 111 can be relatively uniform. For example, the first color sub-pixel block 111 serves as a brightness center, thereby making the light emission of the pixel arrangement structure more uniform. In the extending direction of the perpendicular bisector 1105, there is a relatively large space between two adjacent first color sub-pixel blocks 111, thus facilitating better adjustment of the distance between the two first color sub-pixel blocks 111, or facilitating the increase of the area of the first color sub-pixel blocks 111 to increase the light emitting area, and facilitating homogenization of the first color sub-pixel blocks 111. It should be noted that the length of the second edge 1102 may be or may not be equal to the length of the first edge 1101, and the embodiments of the present disclosure are not limited thereto.

For example, in some examples, the first color sub-pixel block 111, the second color sub-pixel block 112, and the third color sub-pixel block 113 may be separately used as a sub-pixel for display, and the first color sub-pixel block 111, the second color sub-pixel block 112, and the third color sub-pixel block 113 in each virtual rectangle may constitute a pixel unit for color display. Of course, the embodiments of the present disclosure include, but are not limited thereto, the first color sub-pixel block 111, the second color sub-pixel block 112, and the third color sub-pixel block 113 may be merged into one sub-pixel with an adjacent sub-pixel block of identical color located in a different virtual rectangle, for example, at the common edge of the adjacent virtual rectangles, for display. For example, the first edge 1101 passes through the merged sub-pixel, and the merged sub-pixel is symmetrical with respect to the first edge 1101.

For example, in some examples, the first color sub-pixel block 111 is a sensitive color sub-pixel. Due to different sensitivities of human eyes to different colors, when the adjacent sensitive color sub-pixels are close to each other, the two adjacent sensitive color sub-pixels are difficult to be distinguished due to the close distance between the adjacent sensitive color sub-pixels and are regarded as one sub-pixel by human eyes. Therefore, the pixel arrangement structure can improve the distribution uniformity of sensitive color sub-pixels, thereby improving the visual resolution and also improving the display quality. It should be noted that, in a case where the pixel arrangement structure adopts red-green-blue (RGB) mode, the above-mentioned sensitive color is green.

For example, the first color sub-pixel block 111 is a green sub-pixel block G, the second color sub-pixel block 112 is a red sub-pixel block R, and the third color sub-pixel block 113 is a blue sub-pixel block B. Of course, the embodiments of the present disclosure are not limited thereto, and the first color sub-pixel block 111, the second color sub-pixel block 112, and the third color sub-pixel block 113 may be sub-pixel blocks of any colors, such as a yellow sub-pixel block, a white sub-pixel block, and the like. For example, the first color sub-pixel block 111 in the third virtual rectangle 130 and the first color sub-pixel block 111 in the fourth virtual rectangle 140 are formed by using a same mask plate opening to facilitate processing.

Figure 2:
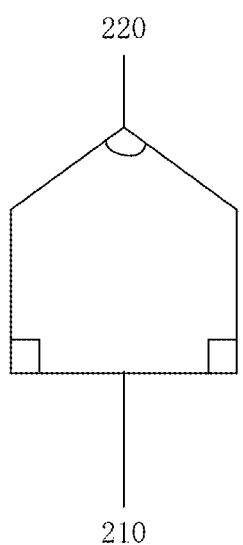
FIG. 2 is a schematic shape diagram of a sub-pixel block in a pixel arrangement structure provided by an embodiment of the present disclosure.

FIG. 2 is a schematic shape diagram of a sub-pixel block in a pixel arrangement structure according to an embodiment of the present disclosure. The shape and distribution of sub-pixel blocks are described with reference to FIGS. 1 and 2. For example, the shapes of the first color sub-pixel block 111, the second color sub-pixel block 112, and the third color sub-pixel block 113 are all symmetrical pentagons having a base angle of a right angle. As illustrated in FIG. 2, the symmetrical pentagon having the base angle of the right angle includes a base 210 and a vertex 220. The base 210 is adjacent to two base angles of the right angle of the symmetrical pentagon having the base angle of the right angle. Among all of the intersections of any two of the adjacent edges of the symmetrical pentagon, the intersection on the perpendicular bisector of the base 210 is the vertex 220.

The first color sub-pixel block 111 is symmetrical with respect to the perpendicular bisector 1105 of the first edge 1101, and the base 210 of the first color sub-pixel block 111 is parallel to the first edge 1101 and is further away from the first edge 1101 compared to the vertex 220 of the first color sub-pixel block 111 in a direction perpendicular to the first edge 1101. The base 210 of the second color sub-pixel block 112 is parallel to or located on the first edge 1101, and is closer to the first edge 1101 compared to the vertex 220 of the second color sub-pixel block 112 in the direction perpendicular to the first edge 1101. The base 210 of the third color sub-pixel block 113 is parallel to or located on the first edge 1101, and is closer to the first edge 1101 compared to the vertex 220 of the third color sub-pixel block 113 in the direction perpendicular to the first edge 1101. For example, the second color sub-pixel block 112 and the third color sub-pixel block 113 are mirror-symmetrical with respect to the perpendicular bisector 1105 of the first edge 1101. For example, the shapes and sizes of the first color sub-pixel block 111, the second color sub-pixel block 112, and the third color sub-pixel block 113 are exactly the same, so that the light emission of the sub-pixel blocks of different colors can be more uniform.

For example, a distance between adjacent edges of two first color sub-pixel blocks 111 is greater than or equal to 12 microns or greater than or equal to 14 microns. For example, the two first color sub-pixel blocks 111 have an axis of symmetry parallel to the perpendicular bisector 1105 (for example, as illustrated in FIG. 1, the axis of symmetry of the first color sub-pixel block 111 in the third virtual rectangle 130 and the first color sub-pixel block 111 in the fourth virtual rectangle 140 is parallel to the perpendicular bisector 1105, and the axis of symmetry passes through the respective vertices of the two first color sub-pixel blocks 111). For example, a distance between intersections of two edges of the two first color sub-pixel blocks 111 which are parallel to the third edge 1303 and the axis of symmetry of the two first color sub-pixel blocks 111 is greater than or equal to 12 microns or greater than or equal to 14 microns. As illustrated in FIG. 1, the two first color sub-pixel blocks 111 in each minimum repeating region 100 refer to, for example, the first color sub-pixel block 111 in the third virtual rectangle 130 and the first color sub-pixel block 111 in the fourth virtual rectangle 140. The adjacent edges of two first color sub-pixel blocks 111 refer to the edges of the two first color sub-pixel blocks 111 respectively parallel to the third edge 1303. The above-mentioned distance of the two first color sub-pixel blocks 111 may be set to different values according to different resolution conditions. For example, the distance between the adjacent edges of the two first color sub-pixel blocks 111 is greater than or equal to 12 microns in the case of a quarter full high definition resolution and is greater than or equal to 14 microns in the case of a full high definition resolution.

It should be noted that, in the embodiments of the present disclosure, the shapes and sizes of the first color sub-pixel block 111, the second color sub-pixel block 112, and the third color sub-pixel block 113 are not limited, and the shapes and sizes of the three may be the same or different, which may depend on actual process conditions. For example, in other embodiments, the shapes of the first color sub-pixel block 111, the second color sub-pixel block 112, and the third color sub-pixel block 113 are trapezoid, and the second color sub-pixel block 112 and the third color sub-pixel block 113 are no longer mirror-symmetrical with respect to the perpendicular bisector 1105 of the first edge 1101, so that the light emitting area of each color sub-pixel block can be flexibly set to meet diversified display requirements.

Figure 3:
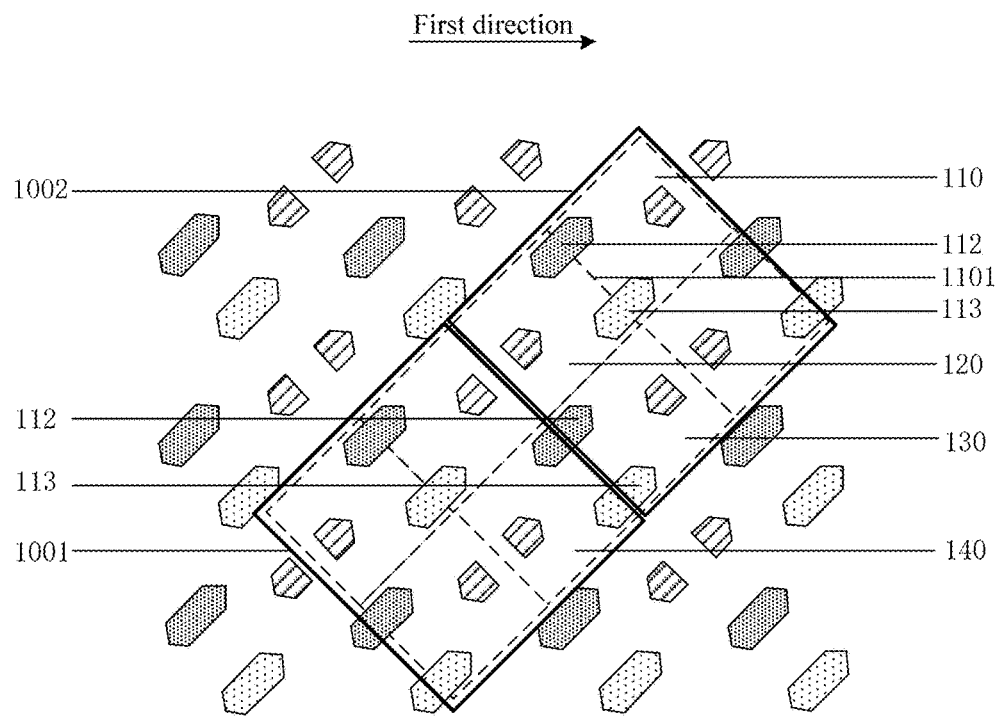
FIG. 3 is a schematic diagram of another pixel arrangement structure provided by an embodiment of the present disclosure.

FIG. 3 is a schematic diagram of a pixel arrangement structure provided by another embodiment of the present disclosure. Referring to FIG. 3, except for the arrangement of the second color sub-pixel block 112 and the third color sub-pixel block 113, the pixel arrangement structure of the present embodiment is substantially the same as that as illustrated in FIG. 1. In this embodiment, two adjacent second color sub-pixel blocks 112 are integrated (i.e., integrally formed) into a same sub-pixel, and two adjacent third color sub-pixel blocks 113 are also integrated into a same sub-pixel. For example, the sub-pixel integrated by the two second color sub-pixel blocks 112 is driven as a whole to emit light as a whole, and the sub-pixel integrated by the two third color sub-pixel blocks 113 is driven as a whole to emit light as a whole.

For example, two adjacent ones of the plurality of minimum repeating regions in the direction perpendicular to the first edge 1101 (e.g., in the direction having an included angle of 45 degrees with the first direction) include a first minimum repeating region 1001 and a second minimum repeating region 1002, respectively. In the same minimum repeating region, for example, in the second minimum repeating region 1002, the second color sub-pixel block 112 in the first virtual rectangle 110 and the second color sub-pixel block 112 in the second virtual rectangle 120 are integrated into a same sub-pixel, the second color sub-pixel block 112 in the first virtual rectangle 110 and the second color sub-pixel block 112 in the second virtual rectangle 120 are respectively a part of the integrated sub-pixel, and the center of the integrated sub-pixel is located on the first edge 1101. The third color sub-pixel block 113 in the first virtual rectangle 110 and the third color sub-pixel block 113 in the second virtual rectangle 120 are integrated into a same sub-pixel, the third color sub-pixel block 113 in the first virtual rectangle 110 and the third color sub-pixel block 113 in the second virtual rectangle 120 are respectively a part of the integrated sub-pixel, and the center of the integrated sub-pixel is located on the first edge 1101. Similarly, in the first minimum repeating region 1001, the second color sub-pixel block 112 and the third color sub-pixel block 113 are arranged in the same manner.

The fourth virtual rectangle 140 in the first minimum repeating region 1001 and the third virtual rectangle 130 in the second minimum repeating region 1002 are adjacent and have a shared edge. The second color sub-pixel block 112 of the fourth virtual rectangle 140 of the first minimum repeating region 1001 and the second color sub-pixel block 112 of the third virtual rectangle 130 of the second minimum repeating region 1002 are integrated into a same sub-pixel, the two second color sub-pixel blocks 112 are respectively a part of the integrated sub-pixel, and the center of the integrated sub-pixel is located on the shared edge of the fourth virtual rectangle 140 of the first minimum repeating region 1001 and the third virtual rectangle 130 of the second minimum repeating region 1002. The third color sub-pixel block 113 of the fourth virtual rectangle 140 of the first minimum repeating region 1001 and the third color sub-pixel block 113 of the third virtual rectangle 130 of the second minimum repeating region 1002 are integrated into a same sub-pixel, the two third color sub-pixel blocks 113 are respectively a part of the integrated sub-pixel, and the center of the integrated sub-pixel is located on the shared edge of the fourth virtual rectangle 140 of the first minimum repeating region 1001 and the third virtual rectangle 130 of the second minimum repeating region 1002.

The two adjacent second color sub-pixel blocks 112 and/or the two adjacent third color sub-pixel blocks 113 are integrated into the same sub-pixel, and can adopt a same opening in the FMM process, thereby simplifying the process and reducing the process difficulty and production costs. For example, the adjacent two second color sub-pixel blocks 112 and/or the adjacent two third color sub-pixel blocks 113 are integrated into a hexagonal shape. In a case where the pixel arrangement structure of the present embodiment is applied in a display panel, a sub-pixel rendering (SPR) algorithm can be used for driving, thereby realizing virtual display.

It should be noted that, in the embodiments of the present disclosure, the second color sub-pixel blocks 112 and the third color sub-pixel blocks 113 may be integrated simultaneously, or only one kind of the second color sub-pixel blocks 112 and the third color sub-pixel blocks 113 may be integrated. In the pixel arrangement structure, all adjacent second color sub-pixel blocks 112 and third color sub-pixel blocks 113 may be integrated, or only part of adjacent second color sub-pixel blocks 112 and third color sub-pixel blocks 113 may be integrated. The shape of the integrated sub-pixel is not limited and can be any shape such as hexagon, pentagon, trapezoid, etc.

Figure 4:
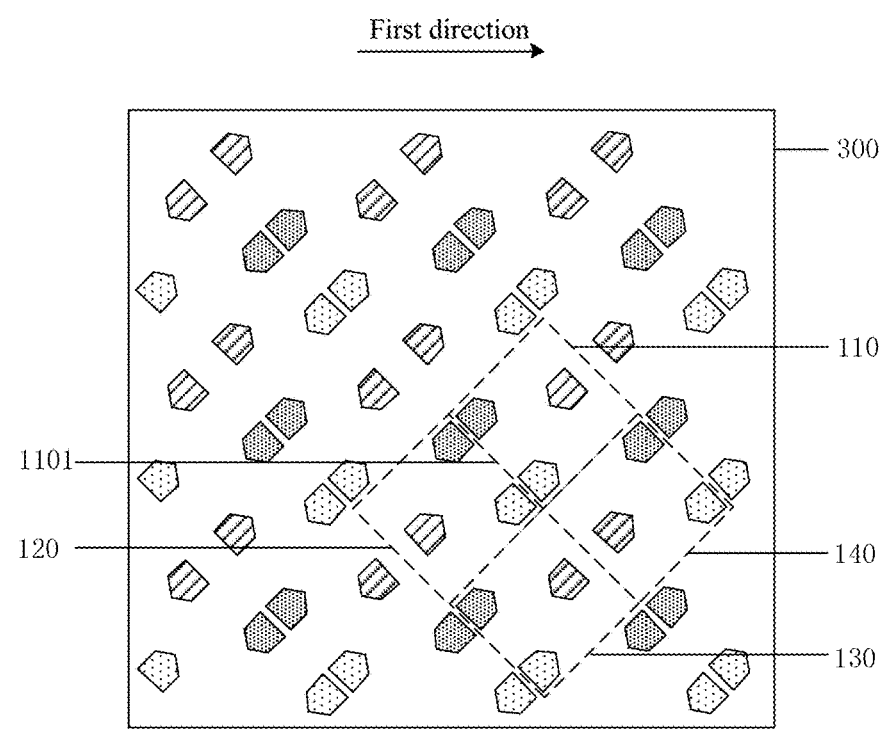
FIG. 4 is a schematic diagram of another pixel arrangement structure provided by an embodiment of the present disclosure.

FIG. 4 is a schematic diagram of another pixel arrangement structure provided by an embodiment of the present disclosure. Referring to FIG. 4, the pixel arrangement structure forms a rectangular arrangement region 300 (the region surrounded by solid lines in FIG. 4). For example, the rectangular arrangement region 300 is a display region. For example, in the four edges of the rectangular arrangement region 300, two edges are parallel to the first direction and the other two edges are perpendicular to the first direction. The first direction is, for example, a row direction or a column direction.

The included angle between any edge of the rectangular arrangement region 300 and any edge of the first virtual rectangle 110 ranges from 40 degrees to 50 degrees, and for example, the included angle is 45 degrees. According to the arrangement of the first virtual rectangle 110, the second virtual rectangle 120, the third virtual rectangle 130, and the fourth virtual rectangle 140 described in FIG. 1, the included angle between any edge of the rectangular arrangement region 300 and any edge of the second virtual rectangle 120, the third virtual rectangle 130, and the fourth virtual rectangle 140 is also 45 degrees. In this way, color edge appearing at the edge of the picture (e.g., a blue edge or a red edge in the direction of any edge of the rectangular arrangement region 300) can be avoided, which is helpful to improve the display quality. For example, in a case where the pixel arrangement structure is applied in a display panel, the horizontal direction when being viewed by human eyes is the same as or perpendicular to the first direction. Because human eyes are more sensitive to the picture quality in the horizontal or vertical direction and are less sensitive to the picture quality in the direction with an included angle of 45 degrees with the horizontal direction, the overall display quality can be improved.

For example, the first direction is a row direction or a column direction specified for matrix display. For example, in a case where the pixel arrangement structure is applied in a display panel, the display panel includes drive lines (e.g., scanning lines or data lines) that are used for driving the pixel arrangement structure, and the first direction is parallel to or perpendicular to an extending direction of the drive lines.

It should be noted that, a shape of a region formed by the pixel arrangement structure in the present embodiment is not limited and may be rectangle, square or other suitable shapes. The angular relationship between any edge of the first virtual rectangle 110 and the region may be determined according to actual requirements. For example, in a case where one edge of the region is the same as the horizontal direction when being viewed by human eyes, any edge of the first virtual rectangle 110 has an included angle with the above-mentioned edge. The distribution form of the pixel arrangement structure in the present embodiment is basically the same as that as described in FIG. 1, and is not repeated herein.

Figure 5:
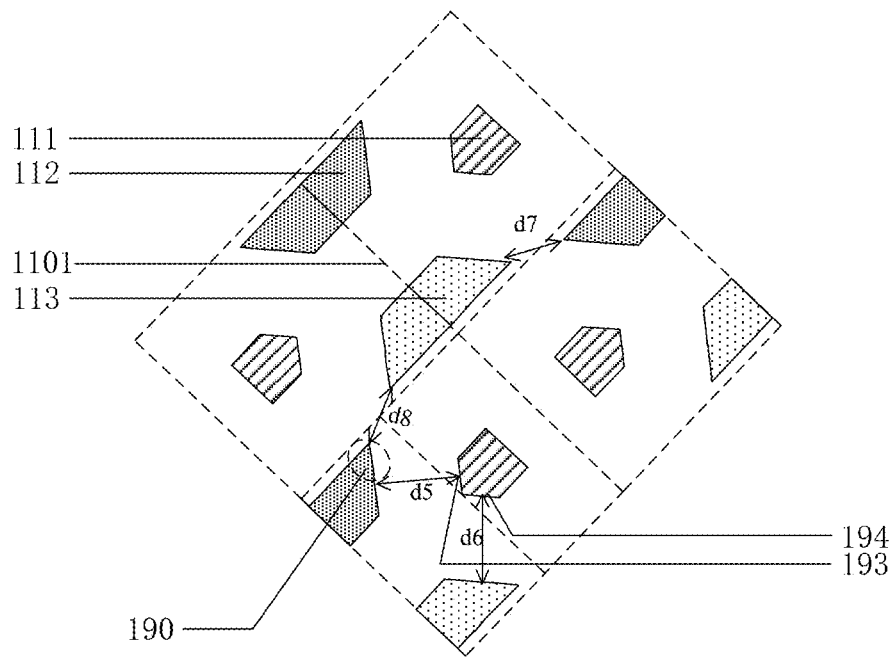
FIG. 5 is a schematic diagram of another pixel arrangement structure provided by an embodiment of the present disclosure.

FIG. 5 is a schematic diagram of another pixel arrangement structure provided by an embodiment of the present disclosure. Referring to FIG. 5, the shapes of the second color sub-pixel block 112 and the third color sub-pixel block 113 are both right-angle trapezoids, bases of the right-angle trapezoids are perpendicular to the first edge 1101, and a distance between a right-angle edge of each of the right-angle trapezoids and the first edge 1101 is smaller than a distance between a bevel edge of each of the right-angle trapezoids and the first edge 1101. As illustrated in FIG. 5, the bevel edges of the second color sub-pixel block 112 and the third color sub-pixel block 113 may be disposed opposite to (facing) the first color sub-pixel block 111, respectively, and the bevel edges of the second color sub-pixel block 112 and the third color sub-pixel block 113 may be parallel or approximately parallel to the two bevel edges of the first color sub-pixel block 111, respectively, so that under the condition of certain process accuracy, that is, in a case where the first color sub-pixel block 111 is at a certain distance from the edges of the second color sub-pixel block 112 and the third color sub-pixel block 113, the area of the second color sub-pixel block 112 and the third color sub-pixel block 113 can be increased. Therefore, the pixel arrangement structure can improve the utilization rate of the space in the virtual rectangles. In addition, because the shapes of the second color sub-pixel block 112 and the third color sub-pixel block 113 are both right-angle trapezoids, compared with the case where the shapes of the second color sub-pixel block 112 and the third color sub-pixel block 113 are both symmetrical pentagon having the base angel of the right angle, an acute-angle portion 190 of the second color sub-pixel block 112 and an acute-angle portion 190 the third color sub-pixel block 113 can further increase the area of the second color sub-pixel block 112 and the third color sub-pixel block 113, so as to further improve the utilization rate of the space in the virtual rectangles.

For example, in some examples, as illustrated in FIG. 5, the shape of the first color sub-pixel block 111 is a symmetrical pentagon having a base angle of a right angle, the symmetrical pentagon having the base angle of the right angle is symmetrical with respect to the perpendicular bisector of the first edge, and a base of the symmetrical pentagon having the base angle of the right angle is parallel to the first edge 1101, and is further away from the first edge in a direction perpendicular to the first edge compared to the vertex of the symmetrical pentagon having the base angle of the right angle. The symmetrical pentagon having the base angle of the right angle includes a third bevel edge 193 and a fourth bevel edge 194 passing through the vertex of the symmetrical pentagon having the base angle of the right angle, a length of the third bevel edge 193 and a length of the fourth bevel edge 194 are the same, the third bevel edge 193 of the first color sub-pixel block 111 is parallel to a bevel edge of the second color sub-pixel block 112 located in the same one of the virtual rectangles and has a spacing of a fifth distance d5, and the fourth bevel edge 194 of the first color sub-pixel block 111 is parallel to a bevel edge of the third color sub-pixel block located in the same one of the virtual rectangles and has a spacing of a sixth distance d6.

For example, in some examples, as illustrated in FIG. 5, in the first virtual rectangle 110 and the second virtual rectangle 120, the third color sub-pixel block 113 is closer to a center of the minimum repeating region 100 compared to the second color sub-pixel block 112, and in the third virtual rectangle 130 and the fourth virtual rectangle 140, the second color sub-pixel block 112 is closer to the center of the minimum repeating region 100 compared to the third color sub-pixel block 113. The third color sub-pixel block 113 in the first virtual rectangle 110 is adjacent to the second color sub-pixel block 112 in the fourth virtual rectangle 140, the third color sub-pixel block 113 in the second virtual rectangle 120 is adjacent to the second color sub-pixel block 112 in the third virtual rectangle 130, a distance between the acute-angle portion 190 of the third color sub-pixel block 113 in the first virtual rectangle 110 and the acute-angle portion 190 of the second color sub-pixel block 112 in the fourth virtual rectangle 140 is a seventh distance d7, and a distance between the acute-angle portion 190 of the third color sub-pixel block 113 in the second virtual rectangle 120 and the acute-angle portion 190 of the second color sub-pixel block 112 in the third virtual rectangle 130 is an eighth distance d8.

For example, in some examples, as illustrated in FIG. 5, the fifth distance d5, the sixth distance d6, the seventh distance d7, and the eighth distance d8 are all equal.

For example, in some examples, as illustrated in FIG. 5, the third color sub-pixel block 113 and the second color sub-pixel block 112 may also be asymmetric in shape, respectively, for example, asymmetric with respect to any straight line passing through the center of the third color sub-pixel block 113 or the second color sub-pixel block 112.

Figure 6:
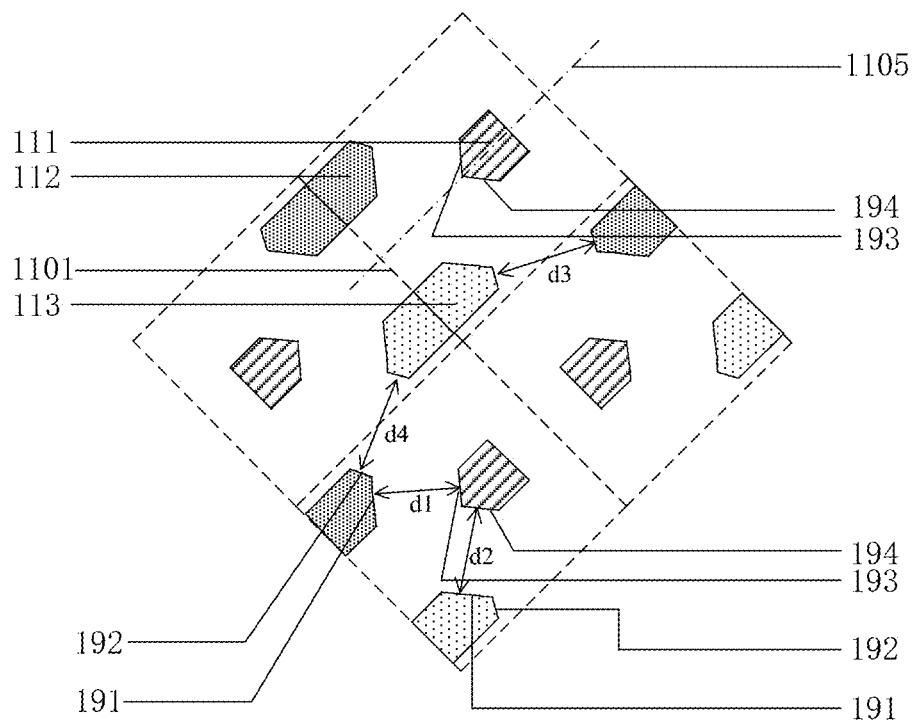
FIG. 6 is a schematic diagram of another pixel arrangement structure provided by an embodiment of the present disclosure.

FIG. 6 is a schematic diagram of another pixel arrangement structure provided by an embodiment of the present disclosure. Referring to FIG. 6, the shapes of the second color sub-pixel block 112 and the third color sub-pixel block 113 are pentagons having a base angle of a right angle, bases of the pentagons having the base angle of the right angle are parallel to or located on the first edge 1101, and are closer to the first edge 1101 compared to the vertexes of the pentagons having the base angle of the right angle in the direction perpendicular to the first edge 1101. The pentagon having the base angle of the right angle includes a first bevel edge 191 and a second bevel edge 192 passing through the vertex of the pentagon having the base angle of the right angle, the first bevel edge 191 is opposite to the first color sub-pixel block 111 located in the same one of the virtual rectangles, and a length of the first bevel edge 191 is larger than a length of the second bevel edge 192. For example, the first bevel edge 191 of the second color sub-pixel block 112 is disposed opposite to the first color sub-pixel block 111, and the first bevel edge 191 of the third color sub-pixel block 113 is disposed opposite to the first color sub-pixel block 111, so that when the process accuracy is constant, that is, in a case where an edge distance between the first color sub-pixel block 111 and the second color sub-pixel block 112 and an edge distance between the first color sub-pixel block 111 and the third color sub-pixel block 113 are constant, area of the second color sub-pixel block 112 and area of the third color sub-pixel block 113 are increased, thereby improving the utilization rate of the space in the virtual rectangles. In addition, because the shapes of the second color sub-pixel block 112 and the third color sub-pixel block 113 are both pentagons having the base angle of the right angle, compared with the case where the shapes of the second color sub-pixel block 112 and the third color sub-pixel block 113 are both symmetrical pentagon having the base angle of the right angle, regions where the second bevel edges 192 of the second color sub-pixel block 112 and the third color sub-pixel block 113 are located can further increase the area of the second color sub-pixel block 112 and the third color sub-pixel block 113, thereby further improving the utilization rate of the space in the virtual rectangles. Compared with the case where the shapes of the second color sub-pixel block 112 and the third color sub-pixel block 113 are both right-angle trapezoids, the second bevel edge 192 of the second color sub-pixel block 112 and the third color sub-pixel block 113 can reduce the manufacturing difficulty. In a case where the processing level is relatively low, the shapes of the second color sub-pixel block and the third color sub-pixel block can adopt pentagons having the base angle of the right angle.

For example, the shape of the first color sub-pixel block 111 is a symmetrical pentagon having a base angle of a right angle, which is symmetrical with respect to the perpendicular bisector 1105 of the first edge 1101, and a base of the symmetrical pentagon having the base angle of the right angle is parallel to the first edge 1101, and is further away from the first edge 1101 compared to the vertex of the symmetrical pentagon having the base angle of the right angle in the direction perpendicular to the first edge 1101. The symmetrical pentagon having the base angle of the right angle includes a third bevel edge 193 and a fourth bevel edge 194 passing through a vertex of the symmetrical pentagon having the base angle of the right angle, and the third bevel edge 193 and the fourth bevel edge 194 have the same length. The third bevel edge 193 of the first color sub-pixel block 111 is parallel to the first bevel edge 191 of the second color sub-pixel block 112 located in the same one of the virtual rectangles and has a spacing of a first distance d1, and the fourth bevel edge 194 of the first color sub-pixel block 111 is parallel to the first bevel edge 191 of the third color sub-pixel block 113 located in the same one of the virtual rectangles and has a spacing of a second distance d2.

For example, in the first virtual rectangle 110 and the second virtual rectangle 120, the second color sub-pixel block 112 is further away from the center of the minimum repeating region 100 compared to the third color sub-pixel block 113. In the third virtual rectangle 130 and the fourth virtual rectangle 140, the third color sub-pixel block 113 is further away from the center of the minimum repeating region 100 compared to the second color sub-pixel block 112. The third color sub-pixel block 113 in the first virtual rectangle 110 is adjacent to the second color sub-pixel block 112 in the fourth virtual rectangle 140, and the third color sub-pixel block 113 in the second virtual rectangle 120 is adjacent to the second color sub-pixel block 112 in the third virtual rectangle 130. The second bevel edge 192 of the third color sub-pixel block 113 in the first virtual rectangle 110 is parallel to the second bevel edge 192 of the second color sub-pixel block 112 in the fourth virtual rectangle 140 and has a spacing of a third distance d3, and the second bevel edge 192 of the third color sub-pixel block 113 in the second virtual rectangle 120 is parallel to the second bevel edge 192 of the second color sub-pixel block 112 in the third virtual rectangle 130 and has a spacing of a fourth distance d4. For example, the first distance d1, the second distance d2, the third distance d3, and the fourth distance d4 are all equal.

At least one embodiment of the present disclosure also provides a pixel arrangement structure. The pixel arrangement structure includes a plurality of first color sub-pixel blocks, a plurality of second color sub-pixel blocks, and a plurality of third color sub-pixel blocks, located in a plurality of minimum repeating regions. Each of the plurality of minimum repeating regions has a rectangular shape and includes four virtual rectangles, the four virtual rectangles include a first virtual rectangle, and the first virtual rectangle includes one first color sub-pixel block of the plurality of first color sub-pixel blocks, one second color sub-pixel block of the plurality of second color sub-pixel blocks, and one third color sub-pixel block of the plurality of third color sub-pixel blocks. The pixel arrangement structure forms a rectangular arrangement region, and any edge of the first virtual rectangle has a non-zero included angle with any edge of the rectangular arrangement region. The first virtual rectangle includes a first edge and a second edge perpendicular to each other, a center of the first color sub-pixel block is on a perpendicular bisector of the first edge, the second color sub-pixel block and the third color sub-pixel block are on different sides of the perpendicular bisector of the first edge, and a distance between a center of the second color sub-pixel block and the first edge and a distance between a center of the third color sub-pixel block and the first edge are both smaller than a distance between the center of the first color sub-pixel block and the first edge.

At least one embodiment of the present disclosure also provides a display substrate. The display substrate includes a base substrate and a plurality of pixels arranged on the base substrate, and the plurality of pixels adopt the pixel arrangement structure according to any embodiment of the present disclosure. The display substrate can balance the distribution of RGB sub-pixel blocks, avoid the color edge at an edge of the picture, help to improve the display quality, and realize real pixel display with a resolution of 300 PPI or slightly higher.

Figure 7:
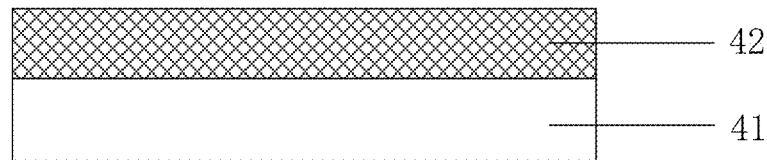
FIG. 7 is a schematic cross-sectional view of a display substrate provided by an embodiment of the present disclosure.

FIG. 7 is a schematic cross-sectional view of a display substrate according to an embodiment of the present disclosure. Referring to FIG. 7, the display substrate includes a base substrate 41 and a plurality of pixels 42. The base substrate 41 serves as a carrier to realize functions of supporting and protection, and may be a glass substrate, a plastic substrate, or the like. The plurality of pixels 42 are disposed on the base substrate 41 and configured to display according to display data. The plurality of pixels 42 adopt the pixel arrangement structure described in any embodiment of the present disclosure. The display substrate can be applied in a liquid crystal display panel or an organic light emitting diode display panel. The display substrate may be, for example, an array substrate or a color film substrate, and the embodiments of the present disclosure are not limited thereto.

Figure 8:
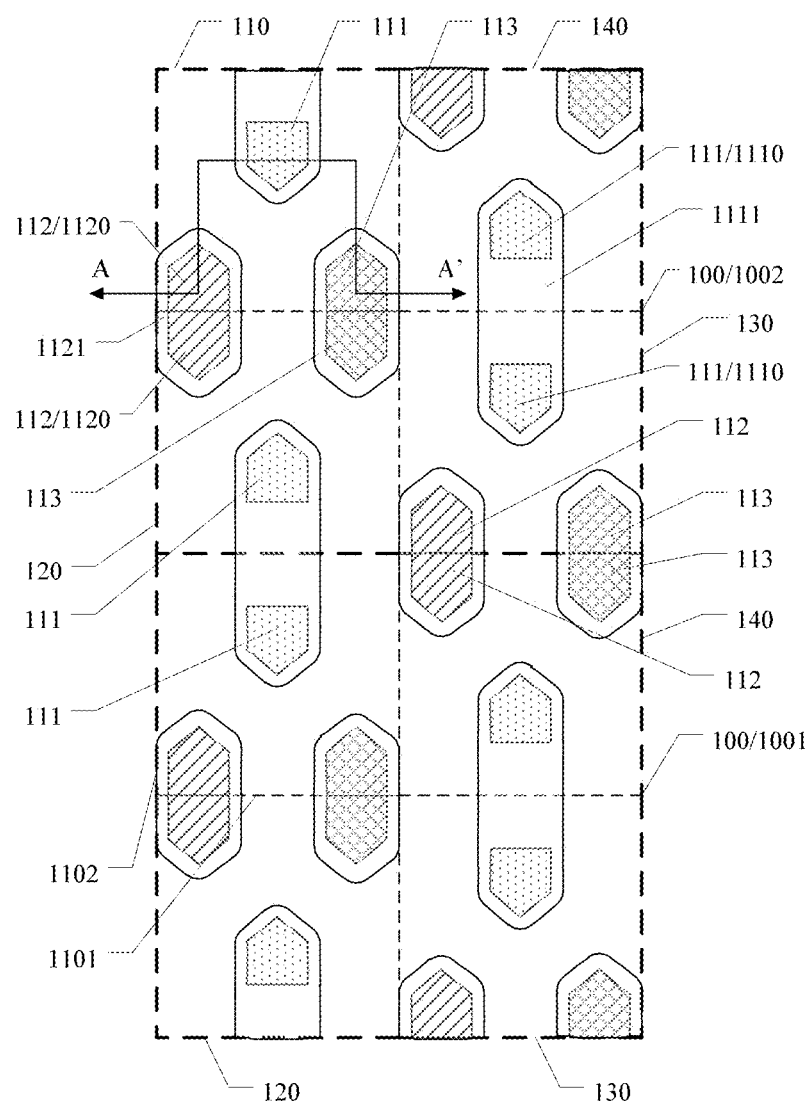
FIG. 8 is a partial plan view of another display substrate provided by an embodiment of the present disclosure.
Figure 9A:
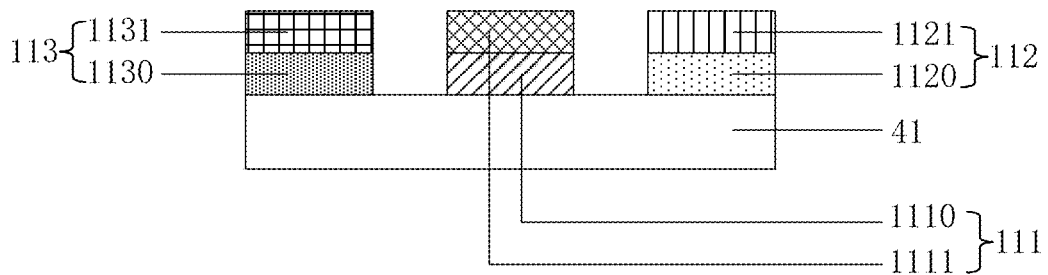
FIG. 9A is a schematic cross-sectional view of a display substrate along the direction A-A' in FIG. 8 provided by an embodiment of the present disclosure.

FIG. 8 is a partial plan view of another display substrate according to an embodiment of the present disclosure. FIG. 9A is a schematic cross-sectional view of a display substrate along the direction A-A' in FIG. 8 according to an embodiment of the present disclosure. As illustrated in FIG. 8, the first color sub-pixel block 111 includes a first color pixel electrode 1110 and a first color light emitting layer 1111 on the first color pixel electrode 1110, the second color sub-pixel block 112 includes a second color pixel electrode 1120 and a second color light emitting layer 1121 on the second color pixel electrode 1120, and the third color sub-pixel block 113 includes a third color pixel electrode 1130 and a third color light emitting layer 1131 on the third color pixel electrode 1130. Thus, the display substrate can be an array substrate.

For example, in some examples, the first color pixel electrode 1110 is configured to drive the first color light emitting layer 1111 to emit light.

For example, the shape of the first color pixel electrode 1110 may be the same as the shape of the first color sub-pixel block 111. Of course, the embodiments of the present disclosure include but are not limited thereto. The shape of the first color pixel electrode 1110 may be different from the shape of the first color sub-pixel block 111, and the shape of the first color sub-pixel block 111 may be defined by a pixel defining layer.

It should be noted that, the above-mentioned shape of the first color sub-pixel block is a shape of a light emitting region of the first color sub-pixel block. In addition, the shape of the first color light emitting layer can be set according to the preparation process, and the embodiments of the present disclosure are not limited herein. For example, the shape of the first color light emitting layer may be determined by a shape of a mask plate opening in the preparation process.

For example, the first color pixel electrode 1110 and the first color light emitting layer 1111 may be in contact with each other, so that the light emitting layer can be driven to emit light at a portion contacting the first color pixel electrode 1110. The portion where the first color pixel electrode 1110 and the first color light emitting layer 1111 are in contact with each other is an effective portion where the sub-pixel can emit light. Therefore, the above-mentioned shape of first color sub-pixel block is a shape of the light emitting region of the first color sub-pixel block. In the embodiments of the present disclosure, the first color pixel electrode 1110 may be an anode, but is not limited to an anode, and a cathode of a light emitting diode may also be used as the pixel electrode.

For example, in some examples, the second color pixel electrode 1120 is configured to drive the second color light emitting layer 1121 to emit light.

For example, the shape of the second color pixel electrode 1120 may be the same as that of the second color sub-pixel block 112. Of course, the embodiments of the present disclosure include but are not limited thereto. The shape of the second color pixel electrode 1120 may be different from the shape of the second color sub-pixel block 112, and the shape of the second color sub-pixel block 112 may be defined by a pixel defining layer.

It should be noted that, the above-mentioned shape of the second color sub-pixel block is a shape of a light emitting region of the second color sub-pixel block. In addition, the shape of the second color light emitting layer can be set according to the preparation process, and the embodiments of the present disclosure are not limited herein. For example, the shape of the second color light emitting layer may be determined by a shape of a mask plate opening in the preparation process.

For example, the second color pixel electrode 1120 and the second color light emitting layer 1121 may be in contact with each other, so that the light emitting layer can be driven to emit light at a portion contacting the second color pixel electrode 1120, and the portion where the second color pixel electrode 1120 and the second color light emitting layer 1121 are in contact with each other is an effective portion where the sub-pixel can emit light. Therefore, the shape of the second color sub-pixel block is a shape of the light emitting region of the second color sub-pixel block. In the embodiments of the present disclosure, the second color pixel electrode 1120 may be an anode, but is not limited to an anode, and the cathode of the light emitting diode may also be used as the pixel electrode.

For example, in some examples, the third color pixel electrode 1130 is configured to drive the third color light emitting layer 1131 to emit light.

For example, the shape of the third color pixel electrode 1130 may be the same as the shape of the third color sub-pixel block 113. Of course, the embodiments of the present disclosure include but are not limited to this. The shape of the third color pixel electrode 1130 may be different from the shape of the third color sub-pixel block 113, and the shape of the third color sub-pixel block 113 may be defined by a pixel defining layer.

It should be noted that, the above-mentioned shape of the third color sub-pixel block is a shape of a light emitting region of the third color sub-pixel block. In addition, the shape of the third color light emitting layer can be set according to the preparation process, and the embodiments of the present disclosure are not limited herein. For example, the shape of the third color light emitting layer may be determined by a mask plate opening in the preparation process.

For example, the third color pixel electrode 1130 and the third color light emitting layer 1131 may be in contact with each other, so that the light emitting layer can be driven to emit light at a portion in contact with the third color pixel electrode 1130, and a portion where the third color pixel electrode 1130 and the third color light emitting layer 1131 are in contact with each other is an effective portion where the sub-pixel can emit light. Therefore, the above-mentioned shape of the third color sub-pixel block is a shape of the light emitting region of the third color sub-pixel block. In the embodiments of the present disclosure, the third color pixel electrode 1130 may be an anode, but is not limited to an anode, and the cathode of the light emitting diode may also be used as the pixel electrode.

It should be noted that, for each sub-pixel, the area of the pixel electrode may be slightly larger than the area of the light emitting layer, or the area of the light emitting layer may be slightly larger than the area of the pixel electrode, and the embodiments of the present disclosure are not particularly limited thereto. For example, the light emitting layer here may include an electroluminescent layer itself and other functional layers located on both sides of the electroluminescent layer, for example, a hole injection layer, a hole transport layer, an electron injection layer, an electron transport layer, and the like. In some embodiments, the shape of the pixel may also be defined by a pixel defining layer. For example, a lower electrode (e.g., an anode) of a light emitting diode may be disposed below the pixel defining layer, and the pixel defining layer includes an opening for defining a pixel that exposes a portion of the lower electrode. In a case where the light emitting layer is formed in the opening in the pixel defining layer as described above, the light emitting layer contacts the lower electrode so that the light emitting layer can be driven to emit light at this portion. Therefore, in this case, the opening of the pixel defining layer defines the shape of the sub-pixel.

For example, the shapes of the various sub-pixels described in the embodiments of the present disclosure are all approximate shapes. When the light emitting layer or various electrode layers is formed, it is not guaranteed that the edges of the sub-pixels are strictly straight lines and the corners are strictly angular. For example, the light emitting layer may be formed by a mask evaporation process, and therefore, corners of the light emitting layer may be rounded. In some cases, as mentioned above, there is a draft angle in a metal etching process, so when the light emitting layer of the sub-pixel is formed by the evaporation process, one corner of the light emitting layer may be removed.

For example, in some examples, as illustrated in FIGS. 8 and 9A, in the same minimum repeating region 100, the first color light emitting layer 1111 of the first color sub-pixel block 111 of the third virtual rectangle 130 and the first color light emitting layer 1111 of the first color sub-pixel block 111 of the fourth virtual rectangle 140 may be formed by using a same mask plate opening, for example, formed through vapor deposition using the same opening of a fine metal mask plate, thereby reducing manufacturing difficulty and simplifying process.

For example, in some examples, area of the first color light emitting layer 1111 of the first color sub-pixel block 111 of the third virtual rectangle 130 and the first color light emitting layer 1111 of the first color sub-pixel block 111 of the fourth virtual rectangle 140 which are integrated into one light emitting layer is larger than a sum of area of the first color pixel electrode 1110 of the first color sub-pixel block 111 of the third virtual rectangle 130 and area of the first color pixel electrode 1110 of the first color sub-pixel block 111 of the fourth virtual rectangle 140.

For example, in some examples, because a distance between a center of the first color sub-pixel block 111 of the third virtual rectangle 130 and a center of the first color sub-pixel block 111 of the fourth virtual rectangle 140 is greater than ½ of a length of the second edge 1102, the area of the first color light emitting layer 1111 of the first color sub-pixel block 111 of the third virtual rectangle 130 and the first color light emitting layer 1111 of the first color sub-pixel block 111 of the fourth virtual rectangle 140 which are integrated into one light emitting layer is 1.5 times larger than the sum of the area of the first color pixel electrode 1110 of the first color sub-pixel block 111 of the third virtual rectangle 130 and the area of the first color pixel electrode 1110 of the first color sub-pixel block 111 of the fourth virtual rectangle 140.

For example, in some examples, as illustrated in FIGS. 8 and 9A, in two adjacent ones of the plurality of minimum repeating regions 100 in the direction perpendicular to the first edge 1101, for example, in the first minimum repeating region 1001 and the second minimum repeating region 1002, the first color light emitting layer 1111 of the first color sub-pixel block 111 of the first virtual rectangle 110 of the first minimum repeating region 1001 and the first color light emitting layer 1111 of the first color sub-pixel block 111 of the second virtual rectangle 120 of the second minimum repeating region 1002 are formed by using a same mask plate opening.

For example, in some examples, the area of the first color light emitting layer 1111 of the first color sub-pixel block 111 of the first virtual rectangle 110 in the first minimum repeating region 1001 and the first color light emitting layer 1111 of the first color sub-pixel block 111 of the second virtual rectangle 120 in the second minimum repeating region 1002 which are integrated into one light emitting layer is larger than a sum of area of the first color pixel electrode 1110 of the first color sub-pixel block 111 of the first virtual rectangle 110 in the first minimum repeating region 1001 and area of the first color pixel electrode 1110 of the first color sub-pixel block 111 of the second virtual rectangle 120 in the second minimum repeating region 1002.

For example, because a distance between a center of the first color sub-pixel block 111 of the first virtual rectangle 110 in the first minimum repeating region 1001 and a center of the first color sub-pixel block 111 of the second virtual rectangle 120 in the second minimum repeating region 1002 is greater than ½ of a length of the second edge 1102, the area of the first color light emitting layer 1111 of the first color sub-pixel block 111 of the first virtual rectangle 110 in the first minimum repeating region 1001 and the first color light emitting layer 1111 of the first color sub-pixel block 111 of the second virtual rectangle 120 in the second minimum repeating region 1002 which are integrated into one light emitting layer is larger than 1.5 times a sum of the area of the first color pixel electrode 1110 of the first color sub-pixel block 111 of the first virtual rectangle 110 in the first minimum repeating region 1001 and the area of the first color pixel electrode 1110 of the first color sub-pixel block 111 of the second virtual rectangle 120 in the second minimum repeating region 1002.

For example, in some examples, as illustrated in FIGS. 8 and 9A, in the same minimum repeating region 100, the second color pixel electrode 1120 of the second color sub-pixel block 112 of the first virtual rectangle 110 and the second color pixel electrode 1120 of the second color sub-pixel block 112 of the second virtual rectangle 120 are integrated into a same pixel electrode, thereby loading data signals as one pixel electrode.

For example, in some examples, as illustrated in FIGS. 8 and 9A, in the two adjacent ones of the plurality of minimum repeating regions 100 in the direction perpendicular to the first edge 1101, for example, in the first minimum repeating region 1001 and the second minimum repeating region 1002, the second color pixel electrode 1120 of the second color sub-pixel block 112 of the fourth virtual rectangle 140 in the first minimum repeating region 1001 and the second color pixel electrode 1120 of the second color sub-pixel block 112 of the third virtual rectangle 130 in the second minimum repeating region 1002 are integrated into a same pixel electrode, thereby loading data signals as one pixel electrode.

For example, in some examples, as illustrated in FIGS. 8 and 9A, in the same minimum repeating region 100, the third color pixel electrode 1130 of the third color sub-pixel block 113 of the first virtual rectangle 110 and the third color pixel electrode 1130 of the third color sub-pixel block 113 of the second virtual rectangle 120 are integrated into a same pixel electrode, thereby loading data signals as one pixel electrode.

For example, in some examples, as illustrated in FIGS. 8 and 9A, in the two adjacent ones of the plurality of minimum repeating regions 100 in the direction perpendicular to the first edge 1101, for example, in the first minimum repeating region 1001 and the second minimum repeating region 1002, the third color pixel electrode 1130 of the third color sub-pixel block 113 of the fourth virtual rectangle 140 in the first minimum repeating region 1001 and the third color pixel electrode 1130 of the third color sub-pixel block 113 of the third virtual rectangle 130 in the second minimum repeating region 1002 are integrated into a same pixel electrode, thereby loading data signals as one pixel electrode.

In addition, as seen from the relationship between the virtual rectangles and the minimum repeating region in FIG. 8, an edge length (or a pitch) of the minimum repeating region is approximately the edge length of two virtual rectangles. As illustrated in FIG. 8, in the same minimum repeating region, the second color sub-pixel block 112 and the third color sub-pixel block 113 in the first virtual rectangle 110 and the second color sub-pixel block 112 and the third color sub-pixel block 113 in the second virtual rectangle 120 can be respectively integrated into one second color sub-pixel and one third color sub-pixel, and can form a repeating unit together with the first color sub-pixel block 111 in the third virtual rectangle 130 and the first color sub-pixel block 111 in the fourth virtual rectangle 140. That is, a size or pitch of the repeating unit in the direction parallel to the first edge 1101 is twice the edge length of the virtual rectangle parallel to the first edge 1101.

As seen from FIG. 8, the second color sub-pixel and the third color sub-pixel have strip-like shapes, i.e., strip-like shapes extending in the direction perpendicular to the first edge 1101. In addition, the second color sub-pixel and the third color sub-pixel may have elliptical shapes. For the second color sub-pixel, if the second color sub-pixel is divided into two parts (such as the second color sub-pixel block 112 in the first virtual rectangle 110 and the second color sub-pixel block 112 in the second virtual rectangle 120) by a center line parallel to the first edge 1101, then a distance between the centers of the two second color sub-pixel blocks 112 is less than 0.3 times the edge length of the virtual rectangle. In addition, the size of the second color sub-pixel in the direction perpendicular to the first edge 1101 is less than 0.6 times the edge length of the virtual rectangle.

For the second color sub-pixel and the third color sub-pixel, a ratio of a size in the direction perpendicular to the first edge 1101 to a size in the direction parallel to the first edge 1101 is $\gamma$, and $\gamma>1$. That is, the second color sub-pixel and the third color sub-pixel have strip-like shapes extending in the direction perpendicular to the first edge 1101.

For example, the second color sub-pixel is a red sub-pixel and the third color sub-pixel is a blue sub-pixel. The service life of red sub-pixels is usually longer than that of blue sub-pixels, so the area of red sub-pixels may be smaller than that of blue sub-pixels, but the above-mentioned size ratio $\gamma$ of red sub-pixels cannot be too small, which may cause obvious difference between horizontal direction and vertical direction.

Figure 9B:
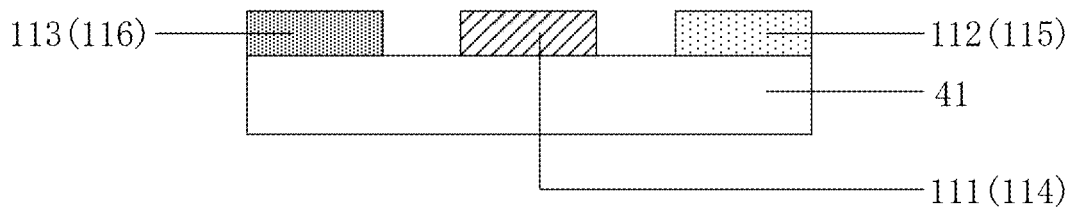
FIG. 9B is a schematic cross-sectional view of another display substrate provided by an embodiment of the present disclosure.

It should be noted that, in various embodiments of the present disclosure, the display substrate may include more or fewer structures, and the positional relationship between the structures is not limited and may be determined according to actual requirements. The colors of the first color sub-pixel block 111, the second color sub-pixel block 112, and the third color sub-pixel block 113 are not limited and may be any colors. The structures of the first color sub-pixel block 111, the second color sub-pixel block 112, and the third color sub-pixel block 113 are not limited and may be determined according to actual requirements. For example, in another example, as illustrated in FIG. 9B, the display substrate is a color film substrate, the first color sub-pixel block 111 includes a first color filter 114, the second color sub-pixel block 112 includes a second color filter 115, the third color sub-pixel block 113 includes a third color filter 116, and the color filter of each color is the same in shape as the sub-pixel block of the corresponding color.

At least one embodiment of the present disclosure also provides a display method of the pixel arrangement structure described in any embodiment of the present disclosure. The display method includes following steps: connecting a plurality of virtual lines crossing each other passing through the plurality of first color sub-pixel blocks along the first direction and a direction perpendicular to the first direction, and determining cross points of the virtual lines as virtual pixel points; allocating display data to the virtual pixel points; and calculating display data of sub-pixel blocks in a corresponding virtual rectangle according to the display data of two of the virtual pixel points adjacent to each of the virtual rectangles. By using the display method, the pixel arrangement structure described in any embodiment of the present disclosure can be driven to display, the color edge phenomenon can be avoided at an edge of the picture, the display quality can be improved, and real pixel display with a resolution of 300 PPI or slightly higher can be achieved.

Figure 10:
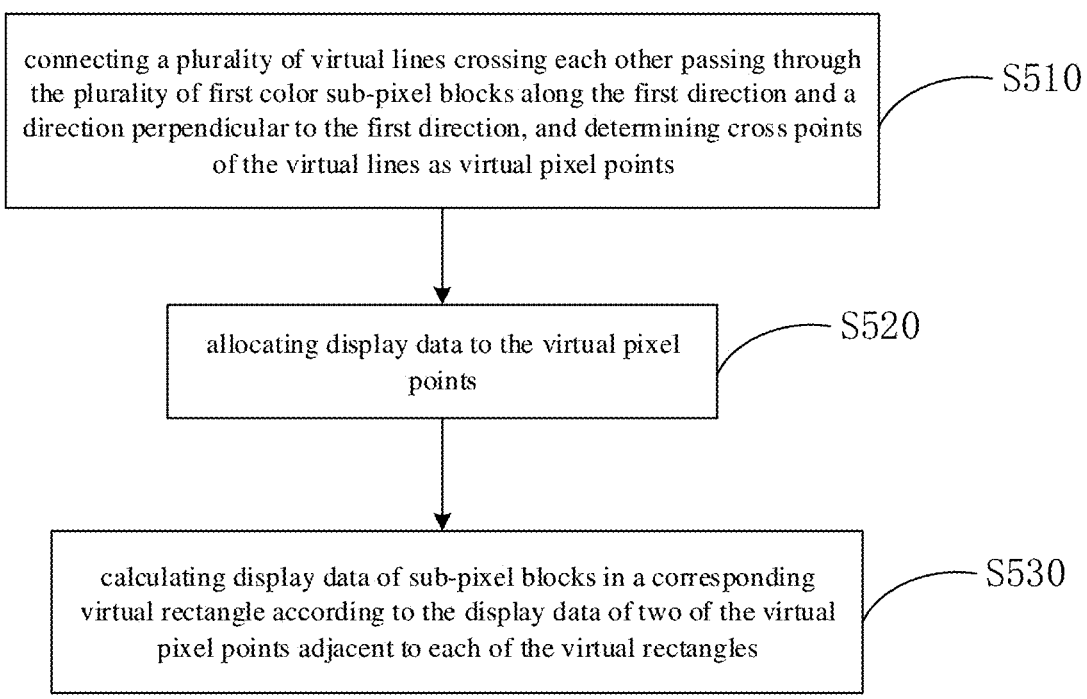
FIG. 10 is a flowchart of a display method provided by an embodiment of the present disclosure.

FIG. 10 is a flowchart of a display method according to an embodiment of the present disclosure. Referring to FIG. 10, the display method includes following steps:

Step S510: connecting a plurality of virtual lines crossing each other passing through the plurality of first color sub-pixel blocks along the first direction and a direction perpendicular to the first direction, and determining cross points of the virtual lines as virtual pixel points;

Step S520: allocating display data to the virtual pixel points; and

Step S530: calculating display data of sub-pixel blocks in a corresponding virtual rectangle according to the display data of two of the virtual pixel points adjacent to each of the virtual rectangles.

Figure 11:
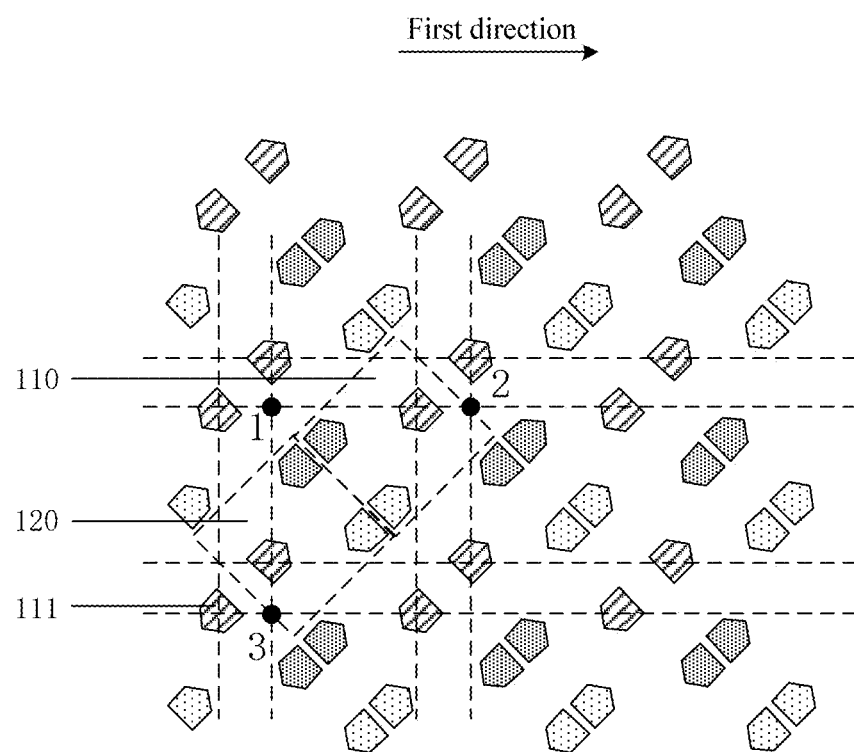
FIG. 11 is a schematic diagram of a pixel arrangement structure provided by an embodiment of the present disclosure.

The display method as illustrated in FIG. 10 is described with reference to the pixel arrangement structure as illustrated in FIG. 11. As illustrated in FIG. 11, in the step S510, a plurality of virtual lines crossing each other are connected which pass through the plurality of first color sub-pixel blocks along the first direction and the direction perpendicular to the first direction, respectively, and the cross points of the virtual lines are determined to be the virtual pixel points. Thus, a plurality of virtual pixel points are obtained, for example, a first virtual pixel point 1, a second virtual pixel point 2, and a third virtual pixel point 3 are obtained. Of course, the embodiments of the present disclosure are not limited thereto, and the number of the virtual pixel points may be any value and may be determined according to the size of the pixel arrangement structure and the number of the first color sub-pixel blocks 111. For example, each of the virtual pixel points is not overlapped with the first color sub-pixel block 111.

For example, the plurality of virtual pixel points are neatly arranged along the first direction and the direction perpendicular to the first direction. The first direction is parallel or perpendicular to an extending direction of drive lines. For example, along the first direction, every two adjacent virtual pixel points have the same distance from each other. For example, along the direction perpendicular to the first direction, the distances between every two adjacent virtual pixel points are also equal. In the step S520, the display data is allocated to the virtual pixel points, i.e., the display data is allocated to a plurality of virtual pixel points arranged in order. For example, the display data allocated to the first virtual pixel point 1 is 1 (r1, g1, b1), the display data allocated to the second virtual pixel point 2 is 2 (r2, g2, b2), and the display data allocated to the third virtual pixel point 3 is 3 (r3, g3, b3). For example, a timing controller arranged outside the display panel can be used to process and allocate the display data to match the size and resolution of the display panel. The allocating method can be similar to the traditional allocating method of the display panel, and the embodiments of the present disclosure are not limited thereto.

The first virtual rectangle 110 and the second virtual rectangle 120 are illustrated in FIG. 11. For example, the display data of the sub-pixel blocks within the first virtual rectangle 110 is represented by A (Ra, Ga, Ba), Ra represents the display data of the second color sub-pixel block 112, Ga represents the display data of the first color sub-pixel block 111, and Ba represents the display data of the third color sub-pixel block 113. Similarly, the display data of the sub-pixel blocks within the second virtual rectangle 120 is represented by B (Rb, Gb, Bb). In the step S530, the display data of the sub-pixel blocks within the corresponding virtual rectangle is calculated based on the display data of the two virtual pixel points adjacent to each virtual rectangle. For example, the display data A (Ra, Ga, Ba) of the sub-pixel blocks within the first virtual rectangle 110 is calculated according to the display data 1 (r1, g1, b1) of the first virtual pixel point 1 and the display data 2 (r2, g2, b2) of the second virtual pixel point 2. The display data B (Rb, Gb, Bb) of the sub-pixel blocks within the second virtual rectangle 120 is calculated according to the display data 1 (r1, g1, b1) of the first virtual pixel point 1 and the display data 3 (r3, g3, b3) of the third virtual pixel point 3.

For example, the calculating method may adopt an interpolation method, for example, an average interpolation method. The display data A (Ra, Ga, Ba) of the sub-pixel blocks within the first virtual rectangle 110 can be calculated as Ra=(r1+r2)/2, Ga=(g1+g2)/2, Ba=(b1+b2)/2. The display data B (Rb, Gb, Bb) of the sub-pixel blocks within the second virtual rectangle 120 can be calculated as Rb=(r1+r3)/2, Gb=(g1+g3)/2, Bb=(b1+b3)/2. In the pixel arrangement structure, sub-pixel blocks in other virtual rectangles are also calculated in this way, so that the display data of the virtual pixel points can be converted into the display data of the sub-pixel blocks in each virtual rectangle in the pixel arrangement structure, and the required image can be displayed. It should be noted that, in various embodiments of the present disclosure, the type of the interpolation method is not limited and may be an average interpolation method, a Lagrange interpolation method, a Newton interpolation method or other applicable interpolation method, which may be determined according to the display effect. Of course, the calculating method is not limited to the interpolation method, but may also be other applicable methods, and the embodiments of the present disclosure are not limited thereto.

For example, in two adjacent virtual rectangles (e.g., the first virtual rectangle 110 and the second virtual rectangle 120) in the direction perpendicular to the first edge 1101 (or the direction having an included angle of 45 degrees with the first direction), two virtual pixel points corresponding to one of the two adjacent virtual rectangles are located in the first direction, and two virtual pixel points corresponding to the other of the two adjacent virtual rectangles are located in the direction perpendicular to the first direction. For example, the first virtual pixel point 1 and the second virtual pixel point 2 corresponding to the first virtual rectangle 110 are located in the first direction, and the first virtual pixel point 1 and the third virtual pixel point 3 corresponding to the second virtual rectangle 120 are located in the direction perpendicular to the first direction. In this way, the display quality of the picture in the first direction and the direction perpendicular to the first direction can be improved.

It should be noted that, in various embodiments of the present disclosure, the display method is not limited to the steps and sequences described above, but may also include more or fewer steps, and the sequences among the various steps may be determined according to actual requirements.

At least one embodiment of the present disclosure also provides a preparing method of the pixel arrangement structure as described in any embodiment of the present disclosure. The pixel arrangement structure can be prepared by the preparing method, which can avoid or alleviate the color edge appearing at the edge of the picture, is helpful for improving display quality, and can realize real pixel display with a resolution of 300 PPI or slightly higher.

For example, in an example, the preparing method of the pixel arrangement structure includes following operations:

performing an evaporating process on an array substrate by using a fine metal mask plate to form the pixel arrangement structure.

For example, the pixel arrangement structure is the pixel arrangement structure as illustrated in any one of FIGS. 1 to 6 and 8.

For example, a net stretching direction of the fine metal mask plate has a non-zero included angle with the first direction, which is, for example, equal to the included angle between any edge of each virtual rectangle in the pixel arrangement structure and the first direction. Therefore, in this way, the net stretching direction of the fine metal mask plate can be consistent with the extending direction of the opening corresponding to each sub-pixel block, so that the stress direction of the fine metal mask plate is consistent with the extending direction of the opening corresponding to each sub-pixel block, which is beneficial to reducing the process difficulty and improving the process precision. In the technological process, such as in the evaporation process, the net stretching direction of the fine metal mask plate can be made to have the included angle with any edge of the array substrate, thereby forming the pattern of the pixel arrangement structure.

It should be noted that, in various embodiments of the present disclosure, the preparing method of the pixel arrangement structure is not limited to the steps and sequences described above, but may also include more steps, and the sequences among the various steps may be determined according to actual requirements.

The foregoing is only the embodiments of the present disclosure and not intended to limit the scope of protection of the present disclosure, and the protection scope of the present disclosure should be based on the protection scope of the appended claims.

What is claimed is:

1. A display substrate, comprising a plurality of first color sub-pixel blocks, a plurality of second color sub-pixel blocks, and a plurality of third color sub-pixel blocks, wherein the display substrate comprises a plurality of first virtual rectangles;

one first color sub-pixel block, one second color sub-pixel block, and one third color sub-pixel block are provided in each first virtual rectangle;

the first virtual rectangle comprises a first edge and a second edge perpendicular to the first edge, both the first edge and the second edge have a non-zero included angle with a first direction, and the first direction is a row direction or a column direction;

in a direction parallel to at least one selected from a group consisting of the second edge, the row direction, and the column direction, a minimum distance between two adjacent second color sub-pixel blocks is smaller than a minimum distance between two adjacent first color sub-pixel blocks, and a minimum distance between two adjacent third color sub-pixel blocks is smaller than the minimum distance between the two adjacent first color sub-pixel blocks; and a maximum size of the first color sub-pixel block in a direction parallel to the second edge is greater than a maximum size of the first color sub-pixel block in the first direction;

the display substrate further comprises a plurality of second virtual rectangles, a plurality of third virtual rectangles, and a plurality of fourth virtual rectangles;

one first virtual rectangle, one second virtual rectangle, one third virtual rectangle, and one fourth virtual rectangle form a 2*2 matrix in an edge-sharing manner to form a minimum repeating region;

the second virtual rectangle shares the first edge with the first virtual rectangle, and is mirror-symmetrical with the first virtual rectangle with respect to the first edge;

the first virtual rectangle coincides with the third virtual rectangle by shifting a distance of a length of a diagonal line of the first virtual rectangle along the diagonal line, and the third virtual rectangle is adjacent to the second virtual rectangle;

the third virtual rectangle comprises a third edge, the fourth virtual rectangle shares the third edge with the third virtual rectangle, and is mirror-symmetrical with the third virtual rectangle with respect to the third edge, and the third edge and the first edge are in a same straight line;

the first color sub-pixel block comprises a first color light emitting layer, the second color sub-pixel block comprises a second color light emitting layer, and the third color sub-pixel block comprises a third color light emitting layer;

in a same minimum repeating region, the first color light emitting layer of the first color sub-pixel block of the third virtual rectangle and the first color light emitting layer of the first color sub-pixel block of the fourth virtual rectangle are formed by sharing a same single color pattern region;

in two adjacent minimum repeating regions in a direction perpendicular to the first edge, the two adjacent minimum repeating regions comprise a first minimum repeating region and a second minimum repeating region, and the first color light emitting layer of the first color sub-pixel block of the first virtual rectangle in the first minimum repeating region and the first color light emitting layer of the first color sub-pixel block of the second virtual rectangle in the second minimum repeating region are formed by sharing a same single color pattern region;

in the same minimum repeating region, an area of the first color light emitting layer of the first color sub-pixel block of the third virtual rectangle and the first color light emitting layer of the first color sub-pixel block of the fourth virtual rectangle formed by sharing the same single color pattern region is larger than a sum of an area of the first color pixel electrode of the first color sub-pixel block of the third virtual rectangle and an area of the first color pixel electrode of the first color sub-pixel block of the fourth virtual rectangle; and an area of the first color light emitting layer of the first color sub-pixel block of the first virtual rectangle in the first minimum repeating region and the first color light emitting layer of the first color sub-pixel block of the second virtual rectangle in the second minimum repeating region formed by sharing the same single color pattern region is larger than a sum of an area of the first color pixel electrode of the first color sub-pixel block of the first virtual rectangle in the first minimum repeating region and an area of the first color pixel electrode of the first color sub-pixel block of the second virtual rectangle in the second minimum repeating region.

2. The display substrate according to claim 1, wherein, in the direction parallel to the second edge, a minimum distance between two adjacent second color sub-pixel blocks is zero, a minimum distance between two adjacent third color sub-pixel blocks is zero, and a minimum distance between at least two adjacent first color sub-pixel blocks is greater than a side length of the second edge.

3. The display substrate according to claim 1, wherein, in the direction parallel to at least one selected from the group consisting of the second edge, the row direction, and the column direction, at least two second color sub-pixel blocks are adjacent and are driven by a same pixel circuit; and/or
in the direction parallel to at least one selected from the group consisting of the second edge, the row direction, and the column direction, at least two third color sub-pixel blocks are adjacent and are driven by a same pixel circuit.

4. The display substrate according to claim 1, wherein a maximum size of the second color sub-pixel block in the direction parallel to the second edge is greater than a maximum size of the second color sub-pixel block in the first direction; and/or
a maximum size of the third color sub-pixel block in the direction parallel to the second edge is greater than a maximum size of the third color sub-pixel block in the first direction.

5. The display substrate according to claim 1, wherein along the direction parallel to the second edge, the plurality of first color sub-pixel blocks, the plurality of second color sub-pixel blocks, the plurality of third color sub-pixel blocks are divided into a plurality of sub-pixel block groups arranged along straight lines; and
along the direction parallel to the second edge, respective sub-pixel blocks in a sub-pixel block group located on a same straight line are of a same color.

6. The display substrate according to claim 5, wherein orthographic projections of sub-pixel blocks in different sub-pixel block groups on a virtual straight line parallel to the first edge do not overlap.

7. The display substrate according to claim 5, wherein along the direction parallel to the second edge, among first color sub-pixel blocks located on a same straight line, distances between adjacent first color sub-pixel blocks among three consecutive first color sub-pixel blocks comprise a first separation distance and a second separation distance, and an absolute value of a difference between the first separation distance and the second separation distance is a first difference value;
along the direction parallel to the second edge, among second color sub-pixel blocks located on a same straight line, distances between adjacent second color sub-pixel blocks among three consecutive second color sub-pixel blocks comprise a third separation distance and a fourth separation distance, and an absolute value of a difference between the third separation distance and the fourth separation distance is a second difference value;
along the direction parallel to the second edge, among third color sub-pixel blocks located on a same straight line, distances between adjacent third color sub-pixel blocks among three consecutive third color sub-pixel blocks comprise a fifth separation distance and a sixth separation distance, and an absolute value of a difference between the fifth separation distance and the sixth separation distance is a third difference value; and
the first difference value is smaller than the second difference value, and the first difference value is smaller than the third difference value.

8. The display substrate according to claim 1, wherein the first color sub-pixel block is of a polygonal shape, and the plurality of first color sub-pixel blocks located on a virtual straight line parallel to the second edge each comprise a vertex located on the virtual straight line.

9. The display substrate according to claim 1, wherein along the direction parallel to the second edge, at least two second color sub-pixel blocks are adjacent and light emitting layers of the two second color sub-pixel blocks are integrated as a whole; and
along the direction parallel to the second edge, at least two first color sub-pixel blocks are adjacent and light emitting layers of the two first color sub-pixel blocks are integrated as a whole.

10. The display substrate according to claim 9, wherein a maximum size of a light emitting layer integrated by the light emitting layers of the two first color sub-pixel blocks in the direction parallel to the second edge is greater than a maximum size of a light emitting layer integrated by the light emitting layers of the two second color sub-pixel blocks in the direction parallel to the second edge.

11. The display substrate according to claim 1, wherein an included angle between any edge of the first virtual rectangle and the first direction ranges from 10 degrees to 50 degrees.

12. The display substrate according to claim 1, wherein the first color sub-pixel block is a green sub-pixel block, the second color sub-pixel block is a red sub-pixel block, and the third color sub-pixel block is a blue sub-pixel block.

13. The display substrate according to claim 1, wherein a shape of the first color sub-pixel block is a symmetrical pentagon having a base angle of a right angle, the symmetrical pentagon having the base angle of the right angle is symmetrical with respect to a perpendicular bisector of the first edge, and a base of the symmetrical pentagon having the base angle of the right angle is parallel to the first edge, and is further away from the first edge compared to a vertex of the symmetrical pentagon having the base angle of the right angle in a direction perpendicular to the first edge.

14. The display substrate according to claim 1, wherein, in a same minimum repeating region, the second color sub-pixel block of the first virtual rectangle and the second color sub-pixel block of the second virtual rectangle are integrated into a same sub-pixel and display together as a whole;
in two adjacent minimum repeating regions in a direction perpendicular to the first edge, the two adjacent minimum repeating regions comprise a first minimum repeating region and a second minimum repeating region, the fourth virtual rectangle in the first minimum repeating region and the third virtual rectangle in the second minimum repeating region are adjacent, and the second color sub-pixel block of the fourth virtual rectangle in the first minimum repeating region and the second color sub-pixel block of the third virtual rectangle in the second minimum repeating region are integrated into a same sub-pixel and display together as a whole;
in the same minimum repeating region, the third color sub-pixel block of the first virtual rectangle and the third color sub-pixel block of the second virtual rectangle are integrated into a same sub-pixel and display together as a whole; and
the third color sub-pixel block of the fourth virtual rectangle in the first minimum repeating region and the third color sub-pixel block of the third virtual rectangle in the second minimum repeating region are integrated into a same sub-pixel and display together as a whole.

15. The display substrate according to claim 1, wherein the plurality of first color sub-pixel blocks, the plurality of second color sub-pixel blocks, and the plurality of third color sub-pixel blocks form a rectangular arrangement region, an included angle between any edge of the rectangular arrangement region and any edge of the first virtual rectangle is 45 degrees, and a maximum size of the rectangular arrangement region in the direction parallel to the second edge is greater than a maximum size of the rectangular arrangement region in the first direction.

16. The display substrate according to claim 1, wherein the first color sub-pixel block comprises a first color pixel electrode, the second color sub-pixel block comprises a second color pixel electrode, and the third color sub-pixel block comprises a third color pixel electrode;

the first color light emitting layer is on the first color pixel electrode, the second color light emitting layer is on the second color pixel electrode, and the third color light emitting layer is on the third color pixel electrode;

the first color pixel electrode is configured to drive the first color light emitting layer to emit light;

the second color pixel electrode is configured to drive the second color light emitting layer to emit light;

the third color pixel electrode is configured to drive the third color light emitting layer to emit light;

a maximum size of the first color light emitting layer in the direction parallel to the second edge is greater than a maximum size of the first color light emitting layer in the first direction;

a maximum size of the second color light emitting layer in the direction parallel to the second edge is greater than a maximum size of the second color light emitting layer in the first direction; and a maximum size of the third color light emitting layer in the direction parallel to the second edge is greater than a maximum size of the third color light emitting layer in the first direction.

17. The display substrate according to claim 16, wherein, in a same minimum repeating region, the second color pixel electrode of the second color sub-pixel block of the first virtual rectangle and the second color pixel electrode of the second color sub-pixel block of the second virtual rectangle are integrated into a same pixel electrode, and the third color pixel electrode of the third color sub-pixel block of the first virtual rectangle and the third color pixel electrode of the third color sub-pixel block of the second virtual rectangle are integrated into a same pixel electrode; and in two minimum repeating regions in a direction perpendicular to the first edge, the two adjacent minimum repeating regions comprise a first minimum repeating region and a second minimum repeating region, the second color pixel electrode of the second color sub-pixel block of the fourth virtual rectangle in the first minimum repeating region and the second color pixel electrode of the second color sub-pixel block of the third virtual rectangle in the second minimum repeating region are integrated into a same pixel electrode, and the third color pixel electrode of the third color sub-pixel block of the fourth virtual rectangle in the first minimum repeating region and the third color pixel electrode of the third color sub-pixel block of the third virtual rectangle in the second minimum repeating region are integrated into a same pixel electrode.

* * * * *